United States Patent [19]
Tanaka et al.

[11] Patent Number: 5,428,231
[45] Date of Patent: Jun. 27, 1995

[54] SOLID-STATE IMAGE DEVICE INCLUDING CHARGE-COUPLED DEVICES HAVING IMPROVED ELECTRODE STRUCTURE

[75] Inventors: Nagataka Tanaka, Yokohama; Yoshiyuki Matsunaga, Kamakura; Michio Sasaki, Yokohama; Hirofumi Yamashita, Kawasaki; Nobuo Nakamura, Tokyo, all of Japan

[73] Assignee: Kabushiki Kaisha Toshiba, Kawasaki, Japan

[21] Appl. No.: 269,349

[22] Filed: Jun. 30, 1994

[30] Foreign Application Priority Data

Jun. 30, 1993 [JP] Japan .................. 5-162918

[51] Int. Cl.$^6$ ............... H01L 29/78; H01L 27/14; H01L 31/00
[52] U.S. Cl. .................. 257/232; 257/233; 257/241; 257/249; 257/250
[58] Field of Search ........... 257/232, 233, 241, 249, 257/250

[56] References Cited

U.S. PATENT DOCUMENTS

| | | | |
|---|---|---|---|
| 4,376,897 | 3/1983 | Byrne et al. | 257/241 |
| 4,774,586 | 9/1988 | Koike et al. | 257/232 |
| 4,998,153 | 3/1991 | Kuyk et al. | 257/241 |
| 5,210,433 | 5/1993 | Ohsawa et al. | |

OTHER PUBLICATIONS

Extended Abstracts of the 22nd (1990 International) Conference on Solid State Devices and Materials, Sendai, 1990, pp. 709-712, ⅓" 600 k-Pixel Interline Transfer CCD Image Sensor with Single Poly-Silicon Electrode Structure.

Primary Examiner—Ngân V. Ngô
Attorney, Agent, or Firm—Oblon, Spivak, McClelland, Maier & Neustadt

[57] ABSTRACT

A solid-state imaging device comprises a plurality of photoelectric conversion accumulation sections arranged two-dimensionally on a semiconductor substrate, a plurality of vertical CCDs for vertically transferring signal charges read out from the photoelectric conversion accumulation sections, and a horizontal CCD for receiving and horizontally transferring the signal charges transferred by the vertical CCDs. A gap between transfer electrodes of the horizontal CCD is less than a gap between transfer electrodes of the vertical CCDs. The transfer electrodes of the vertical CCDs have a single-layer electrode structure formed by patterning a first polysilicon film. The transfer electrodes of the horizontal CCD have an overlapping double-layer electrode structure comprising alternately arranged electrodes formed by patterning the first polysilicon film and electrodes intervening between the alternately arranged electrodes which are formed by patterning a second polysilicon film. The gap between the electrodes of the horizontal CCD is determined by a silicon oxide film obtained by subjecting the alternately arranged electrodes of the first polysilicon film to thermal oxidation.

21 Claims, 19 Drawing Sheets

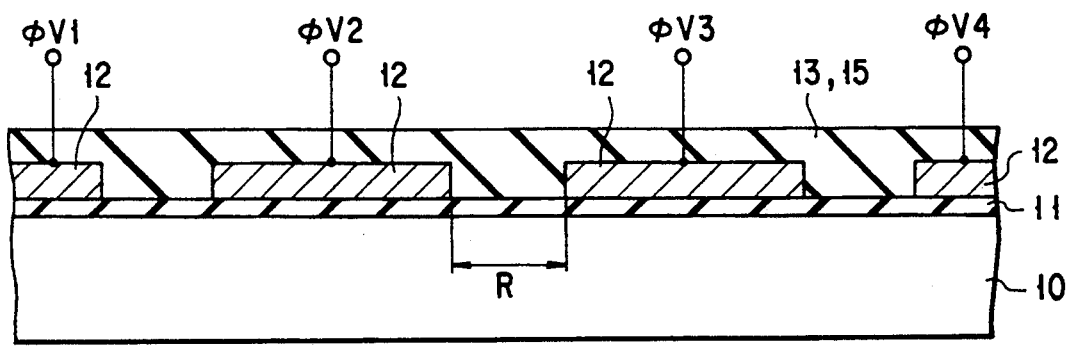
F I G. 1A
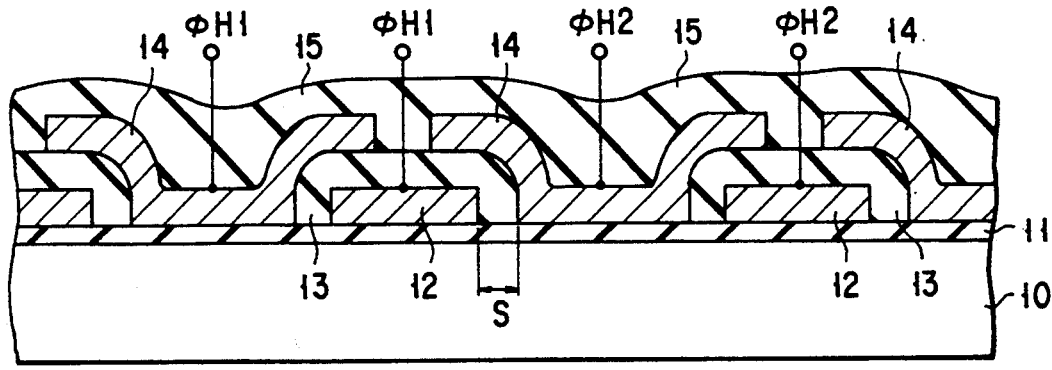
F I G. 1B
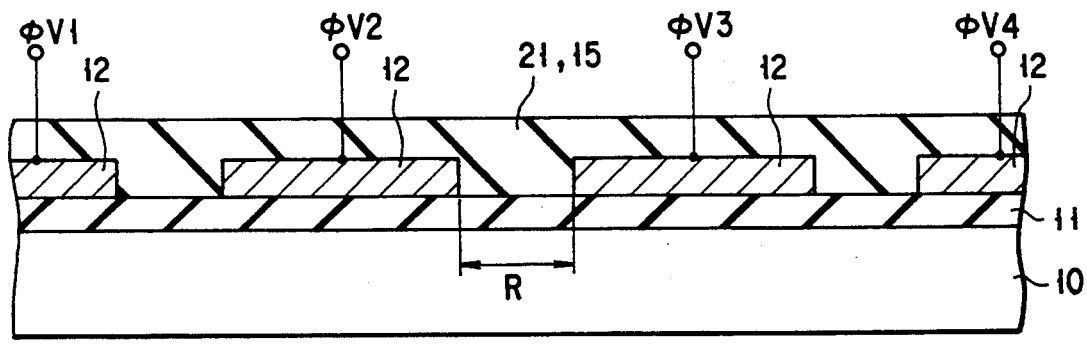
F I G. 3A
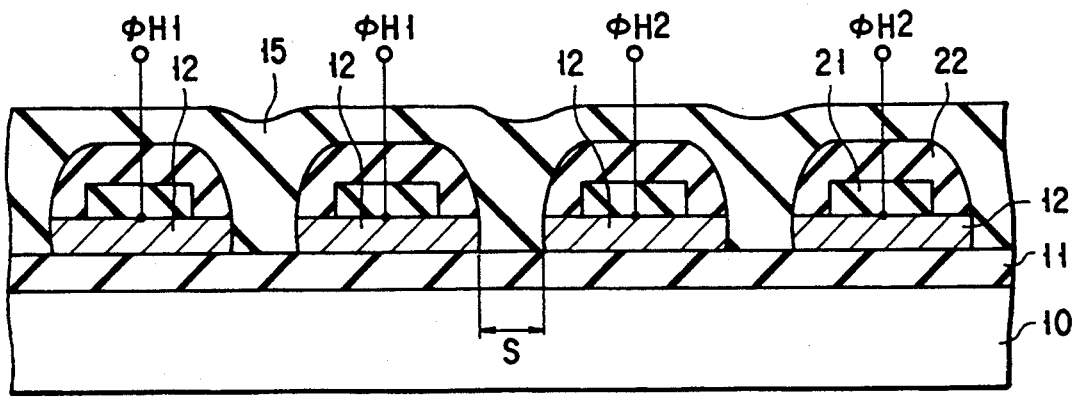
F I G. 3B

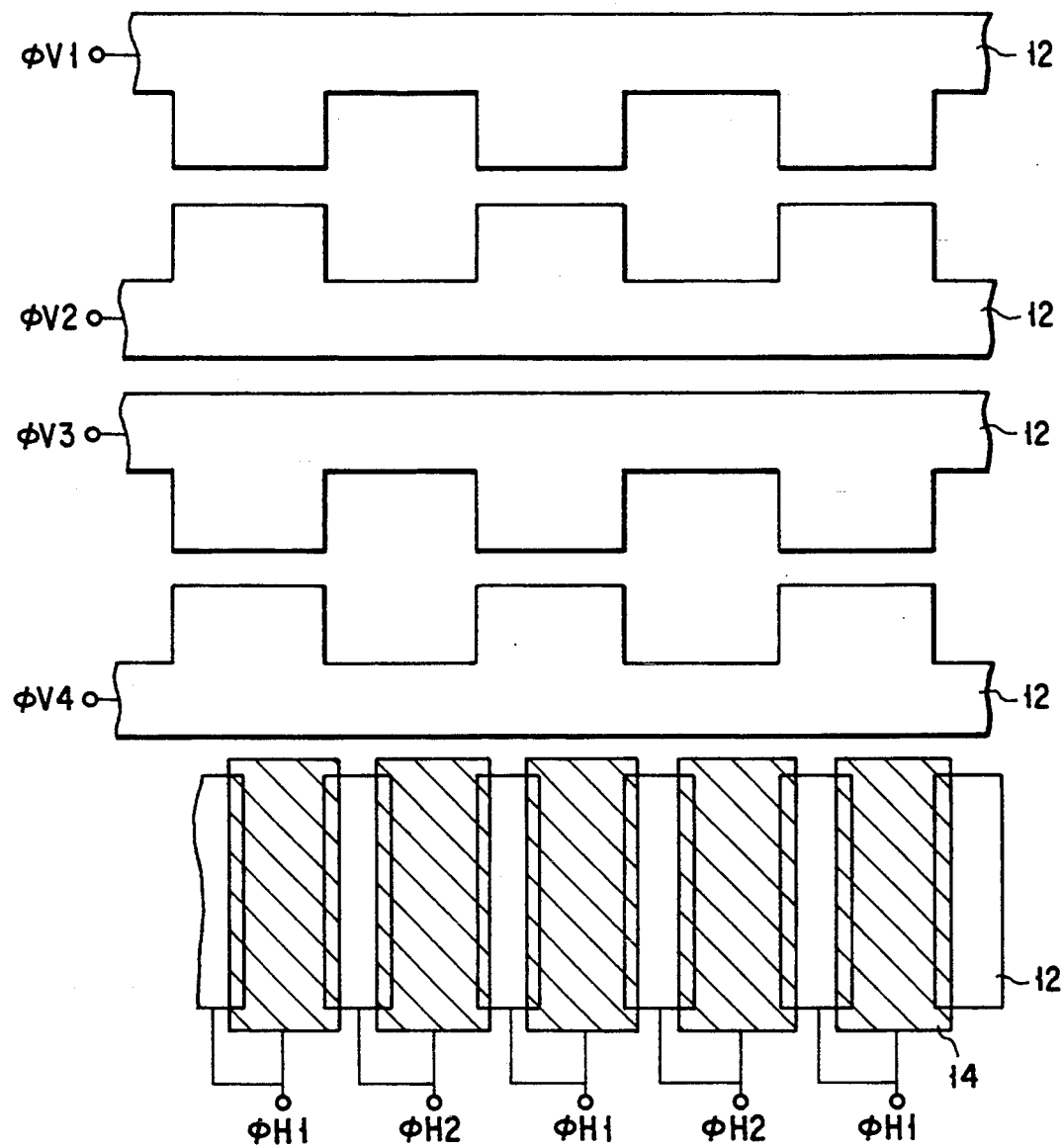
F I G. 2

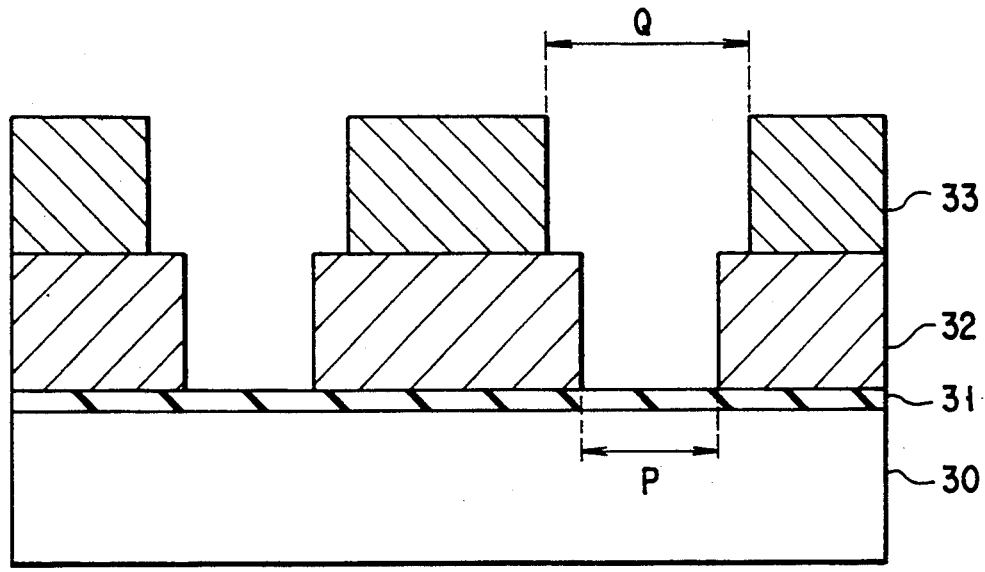
F I G. 8

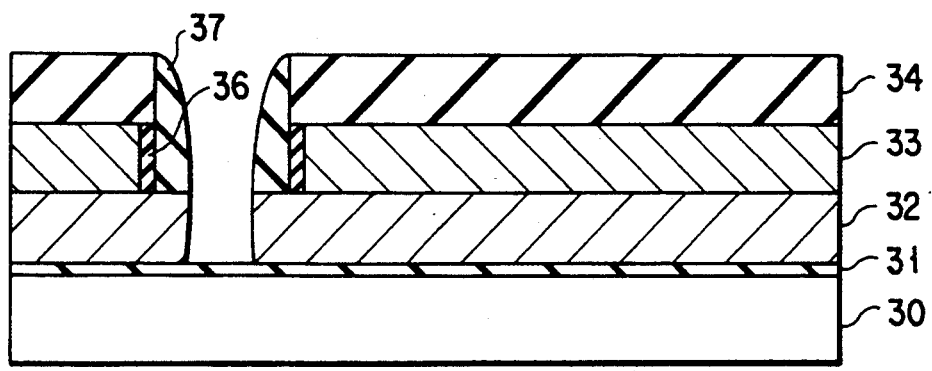
F I G. 16A
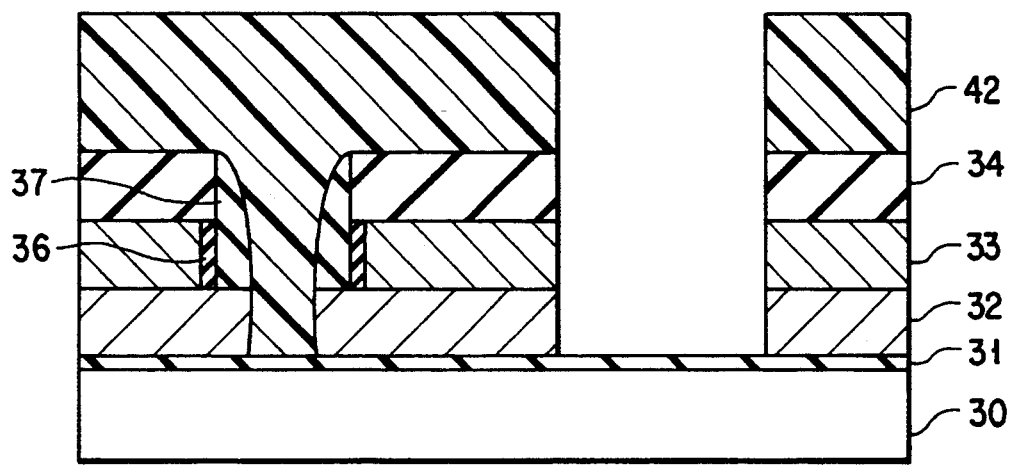
F I G. 16B
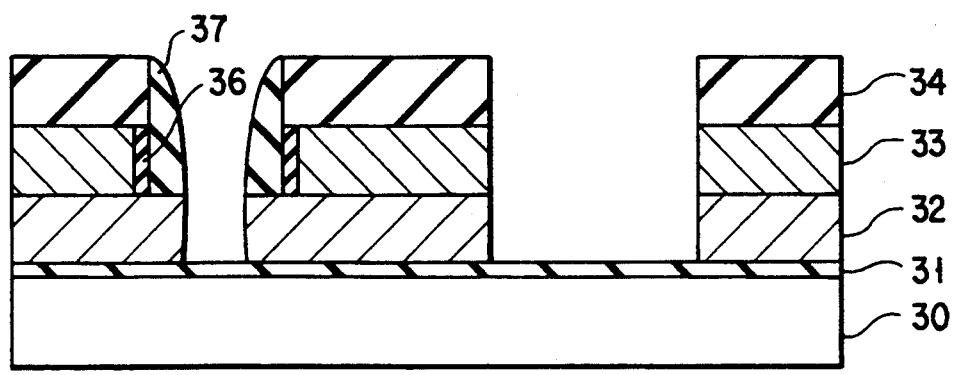
F I G. 16C

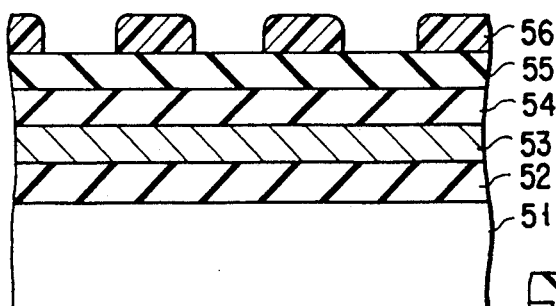
F I G. 17A
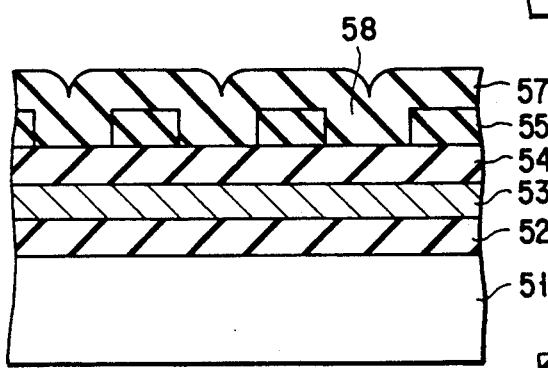
F I G. 17B
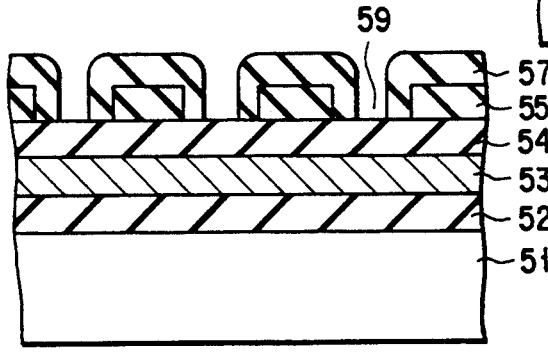
F I G. 17C
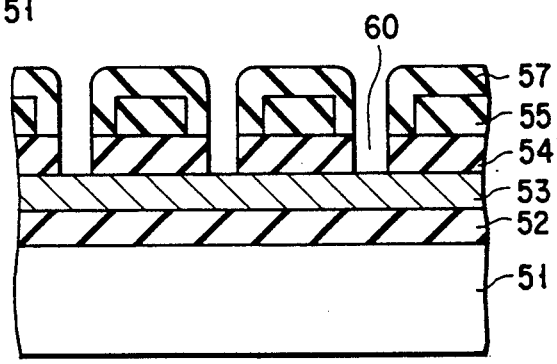
F I G. 17D
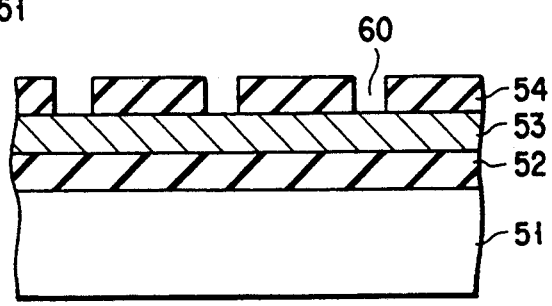
F I G. 17E
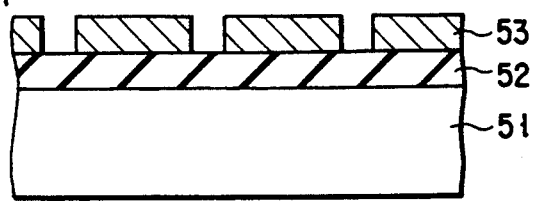
F I G. 17F

SOLID-STATE IMAGE DEVICE INCLUDING CHARGE-COUPLED DEVICES HAVING IMPROVED ELECTRODE STRUCTURE

BACKGROUND OF THE INVENTION

1. Field of the Invention

The present invention relates generally to a solid-state imaging device using CCDs (Charge-Coupled Device), and more particularly to a solid-state imaging device having CCDs with an improved electrode structure.

2. Description of the Related

Recently, a solid-state imaging device using CCDs has been used as an imaging device in a video camera, an electronic still camera, etc. In this solid-state imaging device, photoelectric conversion storage sections for converting input light to electric charges and storing the charges are arranged two-dimensionally, and the stored signal charges are output through vertical CCDs and a horizontal CCD. The vertical CCDs and horizontal CCD have the structures described below.

FIG. 23A is a cross-sectional view of a vertical CCD of a conventional solid-state imaging device having a transfer structure of a single-layer electrode CCD, and FIG. 23B is a cross-sectional view of a horizontal CCD of the same imaging device. Reference numeral 1 denotes a silicon (Si) substrate 1, numeral 2 a first layer polysilicon electrode, and numeral 3 a silicon oxide film. The transfer electrodes of each of the vertical and horizontal CCDs are formed of single-layer polysilicon. When the single-layer polysilicon electrode structure is used for both the vertical and horizontal transfer-electrodes, a gap R (S) between transfer electrodes is normally designed to be a minimum dimension determined by the limit of lithography.

With respect to the layout of the solid-state imaging device, the length of each transfer electrode of the horizontal CCD must be made less than that of each transfer electrode of the vertical CCD. The length of each transfer electrode influences a potential profile at the time of charge transfer. In particular, in a horizontal CCD with short transfer electrodes, the potential profile departs greatly from an ideal one owing to a so-called short-channel effect. More specifically, electrodes 2b and 2c, as shown in the lower parts of FIGS. 23A and 23B, will now be considered by way of example. A potential between the electrodes 2b and 2c is influenced by a gap between the electrode 2b and the preceding electrode 2a and a gap between the electrode 2c and the following electrode 2d. Since the influence is greater in the horizontal CCD, a potential pocket PP occurs between its electrodes 2b and 2c.

The occurrence of the potential pocket in the horizontal CCD degrades a transfer efficiency of the horizontal CCD. In order to solve this problem, it is necessary to increase the driving voltage of the horizontal CCD. In other words, it becomes difficult to lower the driving voltage of the horizontal CCD.

FIG. 24A is a cross-sectional view of a vertical CCD of a conventional solid-state imaging device having a transfer structure of an overlapping double-layer electrode CCD, and FIG. 24B is a cross-sectional view of a horizontal CCD of the same imaging device. Reference numeral 4 denotes a second layer polysilicon electrode. The transfer electrodes of each of the vertical and horizontal CCDs are formed of overlapping double-layer polysilicon. The overlapping double-layer polysilicon structure is used for both the vertical and horizontal transfer electrodes in order to make the gap R (S) between transfer electrodes less than a minimum dimension determined by the limit of lithography, thereby to enhance a transfer efficiency between transfer electrodes, in particular, the transfer efficiency of the horizontal CCD. The gap R (S) between the transfer electrodes is determined by an interlayer insulating film provided between the first layer polysilicon and second layer polysilicon, and the gap R (S) is less than the minimum dimension determined by the limit of lithography.

In the double-layer Si electrode structure, a gap between polysilicon layers is generally filled with a polysilicon oxide film having a low withstand voltage. As a result, short-circuit occurs between polysilicon layers, and initial-stage defects and B-mode defects occur frequently. Consequently, the reliability of video cameras and still cameras using solid-state imaging devices is degraded. The gap between the transfer electrodes is made equal to the minimum gap limited by an electrode manufacturing process and a withstand voltage (leak-current, etc.).

Recently, there has been a demand for miniaturization of a solid-state imaging device in accordance with reduction in size and weight of cameras. At present the size of a photoelectric conversion storage section (or "cell") is 9 µm. In future, this size is planned to be reduced to 5 µm or less. In order to further enhance the transfer efficiency with such miniaturization of cell size, the gap between transfer electrodes will be decreased more and more.

However, if the gap between the transfer electrodes decreases, short-circuit between polysilicon layers occurs and the yield decreases. In each of the above-described prior art examples, the gap between the transfer electrodes of the horizontal CCD is equal to that of the vertical CCD. Since the area of the vertical CCD is much greater than that of the horizontal CCD, short-circuit between polysilicon layers occurs in the vertical CCD.

In order to obtain a low-resistance transfer electrode of a CCD, a polycide structure wherein polysilicon and silicide of a refractory metal are laminated may be adopted. In this case, the gap between transfer electrodes in the silicide is equal to that in the polysilicon. Normally, after a pattern of transfer electrodes is formed by etching, post-oxidation is performed to increase a withstand voltage. However, since an oxide film of a silicide has a lower withstand voltage than an oxide film of a polysilicon, a withstand voltage across transfer electrodes lowers and the yield decreases.

In the prior art, if the inter-electrode gap is decreased to enhance the CCD transfer efficiency, as described above, short-circuit occurs between the polysilicon electrodes. Thus, the inter-electrode gap is set at a minimum gap limited by the electrode formation process and withstand voltage (leak current, etc.). This is a factor to prevent enhancement of transfer efficiency of CCDs (in particular, horizontal CCD). Besides, when the polycide structure is adopted in transfer electrodes of the CCD, the withstand voltage of the oxide film of silicide is low and the yield decreases. In addition, if miniaturization is advanced, the transfer efficiency of the horizontal CCD is degraded due to the short channel effect of the horizontal CCD.

SUMMARY OF THE INVENTION

An object of the present invention is to provide a solid-state imaging device wherein a transfer efficiency of a horizontal CCD can be fully enhanced and short-circuit between transfer electrodes can be curbed.

Another object of the invention is to provide a solid-state imaging device wherein a sufficient withstand voltage is obtained even if transfer electrodes of a CCD are formed in a polycide structure.

A solid-state imaging device according to the present invention comprises: a plurality of photoelectric conversion sections arranged two-dimensionally on a semiconductor substrate; a plurality of vertical CCDs for vertically transferring signal charges read out from the photoelectric conversion sections, each vertical CCD including a plurality of transfer electrodes arranged with a first gap present between adjacent ones in the direction of transfer of the signal charges; and a horizontal CCD for receiving and horizontally transferring the signal charges transferred by the vertical CCDs, the horizontal CCD including a plurality of transfer electrodes arranged with a second gap present between adjacent ones in the direction of transfer of the signal charges, the second gap being less than the first gap.

Preferred embodiments of the present invention are as follows:

(1) The transfer electrodes of the vertical CCDs have a single-layer polysilicon structure and the transfer electrodes of the horizontal CCD have a double-layer polysilicon structure.

(2) The vertical CCDs and horizontal CCD are formed in a single-layer polysilicon construction, and the gap between the transfer electrodes of the horizontal CCD is made less than a minimum dimension of lithography by a side-wall-leaving technique.

(3) The vertical CCDs and horizontal CCD are formed in a single-layer polysilicon construction, and the gap between the transfer electrodes of the horizontal CCD is made less than a minimum dimension of ordinary lithography by an exposure technique utilizing a phase shifter.

The present invention also provides a solid-state imaging device wherein vertical CCDs or a horizontal CCD have a polycide structure in which a refractory metal silicide layer is laminated on a polysilicon layer, and the inter-electrode gap between silicide portions is made greater than that between polysilicon portions.

According to the present invention, a gap between transfer electrodes is narrow in a horizontal CCD in which a transfer electrode length is small and a short-channel effect tends to occur. Thus, the transfer electrode length of the horizontal CCD can be increased, and the short-channel effect can be curbed. Therefore, finer solid-state imaging devices can be manufactured while the transfer efficiency of the horizontal CCD can be fully increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B are cross-sectional views showing a vertical CCD and a horizontal CCD of a solid-state imaging device according to an embodiment of the present invention;

FIG. 2 shows plan views of the vertical and horizontal CCDs of the device shown in FIGS. 1A and 1B;

FIGS. 3A and 3B are cross-sectional views showing a vertical CCD and a horizontal CCD of a solid-state imaging device according to another embodiment of the invention;

FIG. 8 is a cross-sectional view showing a CCD of a solid-state imaging device according to another embodiment of the invention;

FIGS. 16A to 16C are cross-sectional views illustrating manufacturing steps of a structure according to the embodiment of FIGS. 15A and 15B;

FIGS. 17A to 17F are cross-sectional views illustrating manufacturing steps of an Al wiring pattern according to another embodiment of the invention;

DETAILED DESCRIPTION OF THE PREFERRED EMBODIMENTS

Figure 4A:
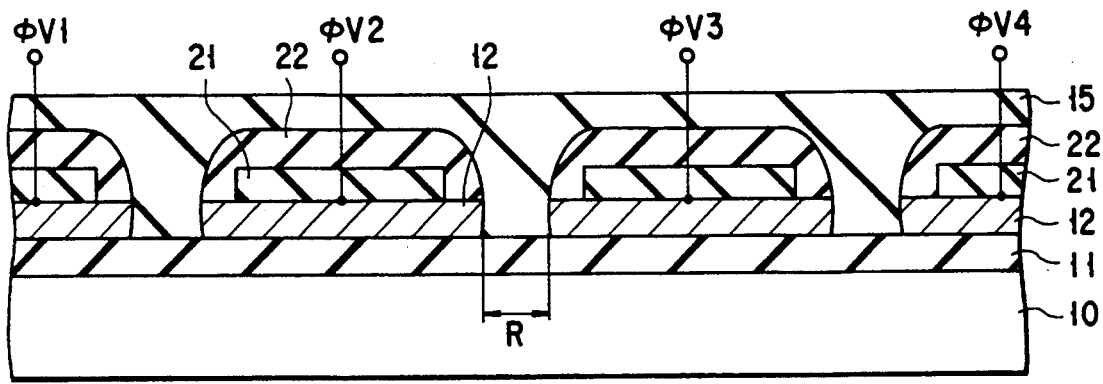
FIGS. 4A and 4B are cross-sectional views showing a vertical CCD and a horizontal CCD of a solid-state imaging device according to another embodiment of the invention.

FIGS. 1A and 1B are cross-sectional views showing a vertical CCD and a horizontal CCD of a solid-state imaging device according to an embodiment of the present invention, and FIG. 2 shows plan views of the vertical and horizontal CCDs of the device shown in FIGS. 1A and 1B.

In this embodiment, a gate insulating film 11 is formed on the Si substrate 10. Then, a first polysilicon film is deposited on the insulating film 11 and is patterned by RIE (Reactive Ion Etching), etc. by use of lithographic technique, thus forming electrodes 12. After the first polysilicon electrodes 12 were formed by the patterning, an interlayer insulating film 13 of silicon oxide is formed on the resultant structure by thermal oxidation. Subsequently, a second polysilicon film is deposited on the gate insulating film 11 and insulating film 13. The second polysilicon film is patterned by RIE, etc. by using lithographic technique, thus forming electrodes 14. An insulating film 15 is formed on the oxide film 13 and second polysilicon electrodes 14.

In the vertical CCD, the first polysilicon electrodes 12 constitute a four-phase drive transfer electrode structure. In the horizontal CCD, the first polysilicon electrodes 12 and second polysilicon electrodes 14 constitute a two-phase drive transfer electrode structure. The length of each transfer electrode 12 of the vertical CCD in the direction of transfer is greater than the length of each transfer electrode 12, 14 of the horizontal CCD in the direction of transfer.

Since the vertical CCD comprises single-layer polysilicon electrodes 12, the inter-electrode gap R is set at, e.g. 0.3 μm, or a minimum dimension determined by lithographic techniques recently developed more and more. On the other hand, since the horizontal CCD comprises overlapping double-layer polysilicon electrodes 12 and 14, the inter-electrode gap S is less than the gap R between electrodes 12 of the vertical CCD and set at, e.g. about 0.1 λm. In the overlapping double-layer polysilicon structure, the gap S between the transfer electrodes is determined by the thickness of the interlayer insulating film between the first polysilicon electrodes 12 and second polysilicon electrodes 14, i.e. the thickness of the thermally oxidized film 13. The thickness of the thermally oxidized film 13 is less than a minimum dimension determined by the limit of lithography. Accordingly, the gap S of the transfer electrodes of the horizontal CCD can be made less than the gap R between the transfer electrodes of the vertical CCD.

In general, the single-layer polysilicon structure has a disadvantage in respect of transfer efficiency. However, the processing of the single-layer polysilicon structure is easier than that of the double-layer polysilicon structure, and the number of manufacturing steps of the former is less. Thus, the possibility of short-circuit between polysilicon layers is low, and solid-state imaging devices can be fabricated with a high yield. In this embodiment, vertical transfer electrodes which are longer in the direction of transfer than, and have larger areas than, the horizontal transfer electrodes are formed in the single-layer polysilicon structure, thereby increasing the yield. In addition, since the vertical transfer electrodes have a lower drive frequency than the horizontal transfer electrodes, there is no problem regarding the transfer efficiency even if the single-layer polysilicon structure is adopted. On the other hand, since the double-layer polysilicon structure is adopted for the horizontal transfer electrodes, no problem occurs with respect to the transfer efficiency even if the drive frequency for the horizontal transfer electrodes is increased.

As has been described above, according to this embodiment, the transfer electrodes of the vertical CCD are formed in the single-layer polysilicon structure and the transfer electrodes of the horizontal CCD are formed in the double-layer polysilicon structure. Thus, the gap S between the horizontal transfer electrodes can be made less than the gap R between the vertical transfer electrodes. Since the gap is small, the electrode length of the horizontal CCD is made greater than in the prior art, the short channel effect can be suppressed, and the transfer efficiency of the horizontal CCD can be fully increased. In addition, the short-circuit between the transfer electrodes can be curbed.

FIGS. 3A and 3B are cross-sectional views showing a vertical CCD and a horizontal CCD of a solid-state imaging device according to another embodiment of the invention. The elements corresponding to those in the preceding embodiment are denoted by the same reference numerals, and a description thereof is omitted.

In this embodiment, a vertical CCD comprises single-layer polysilicon electrodes 12 patterned by RIE, etc. by using lithographic technique. The gap R between the electrodes 12 is set at, e.g. 0.3 μm, or a minimum dimension determined by lithographic techniques recently developed more and more. On the other hand, a horizontal CCD comprises single-layer polysilicon electrodes 12 patterned by so-called "side-wall-leaving" technique. Thereby, the gap S between the electrodes of the horizontal CCD is made less than the gap R between the electrodes of the vertical CCD and set at, e.g. 0.2 μm.

In the vertical CCD, the polysilicon electrodes 12 constitute a four-phase drive transfer electrode structure. In the horizontal CCD, the polysilicon electrodes 12 constitute a two-phase drive transfer electrode structure. The length of each transfer electrode 12 of the vertical CCD in the direction of transfer is greater than the length of each transfer electrode 12 of the horizontal CCD in the direction of transfer.

The process using the side-wall-leaving technique will now be described. A gate insulating film 11 and a polysilicon film are formed on a substrate 10. A silicon oxide film is formed on the polysilicon film by CVD, etc. The silicon oxide film is patterned with a minimum dimension determined by lithographic technique, and a patterned oxide film 21 is obtained. Then, a silicon nitride film 22 is formed on the entire resultant structure by CVD, etc. The silicon nitride film 22 is etched back to leave the patterned nitride film 22 only on the oxide film 21 and side walls thereof. Then, using the patterned nitride film 22 as a mask, the polysilicon film is etched and electrodes 12 of the horizontal CCD is obtained.

In this embodiment, the gap S between the electrodes of the horizontal CCD is determined by the distance between the separate portions of the nitride film 22 obtained by the side-wall-leaving technique. By virtue of the characteristics of this etching technique, the nitride film is selectively etched at portions where the oxide film 21 is not present. Accordingly, the distance between the separate portions of the nitride film 22 can be made less than the distance between the separate portions of the oxide film 21 set at a minimum dimension of the lithographic technique. Therefore, the gap S between the transfer electrodes of the horizontal CCD can be made less than the gap R between the transfer electrodes of the vertical CCD.

Figure 4B:
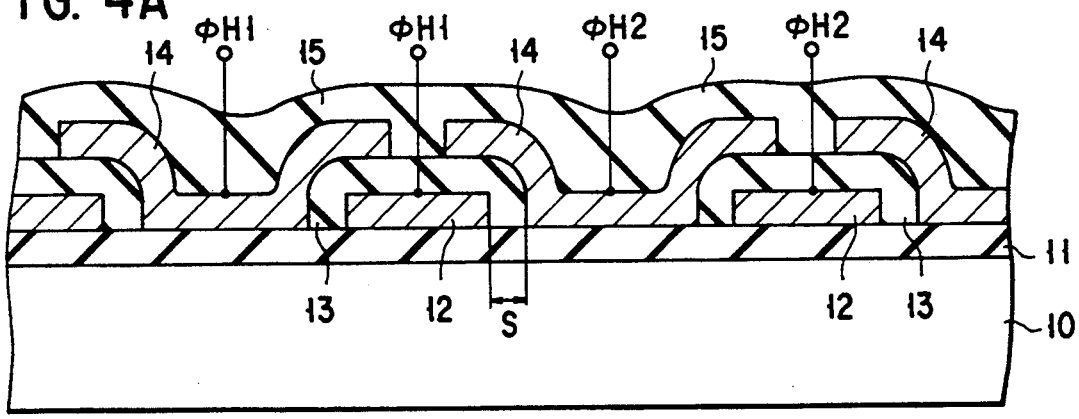

FIGS. 4A and 4B are cross-sectional views showing a vertical CCD and a horizontal CCD of a solid-state imaging device according to another embodiment of the invention. The elements corresponding to those in the preceding embodiments are denoted by the same reference numerals, and a description thereof is omitted.

In this embodiment, the vertical CCD comprises single-layer polysilicon electrodes 12 patterned by the above-described "side-wall-leaving" technique. The gap R between the electrodes 12 of the vertical CCD is less than a minimum dimension determined by the lithographic technique and set at, e.g. about 0.2 μm. On the other hand, the horizontal CCD comprises overlapping double-layer polysilicon electrodes 12 and 14. The gap S between the electrodes 12 and 14 of the horizontal CCD is determined by the thickness of a thermal oxide film 13. The gap S is less than the gap R between the electrodes 12 of the vertical CCD and set at, e.g. about 0.1 μm.

In the vertical CCD, the polysilicon electrodes 12 constitute a four-phase drive transfer electrode structure. In the horizontal CCD, the polysilicon electrodes 12 and 14 constitute a two-phase drive transfer electrode structure. The length of each transfer electrode 12 of the vertical CCD in the direction of transfer is greater than the length of each transfer electrode 12, 14 of the horizontal CCD in the direction of transfer.

As has been described above, by combining the electrodes 12 and overlapping double-layer electrodes 12 and 14, the gap S between the transfer electrodes of the horizontal CCD can be made less than the gap R between the transfer electrodes of the vertical CCD.

Figure 5A:
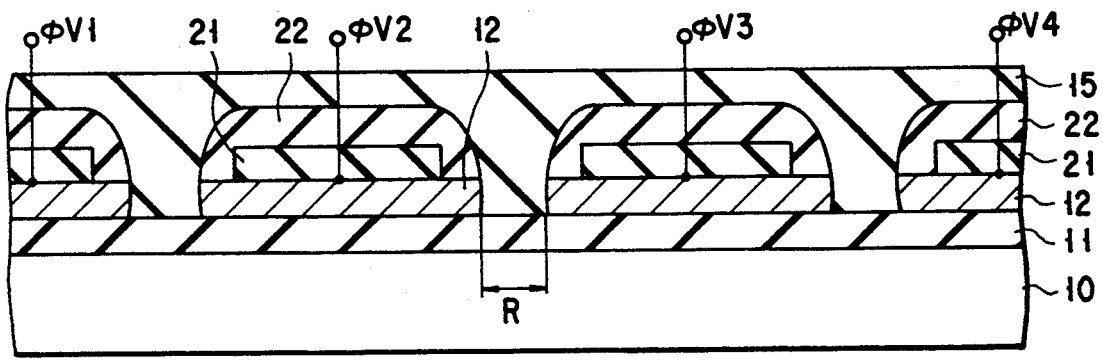
FIGS. 5A and 5B are cross-sectional views showing a vertical CCD and a horizontal CCD of a solid-state imaging device according to another embodiment of the invention.
Figure 5B:
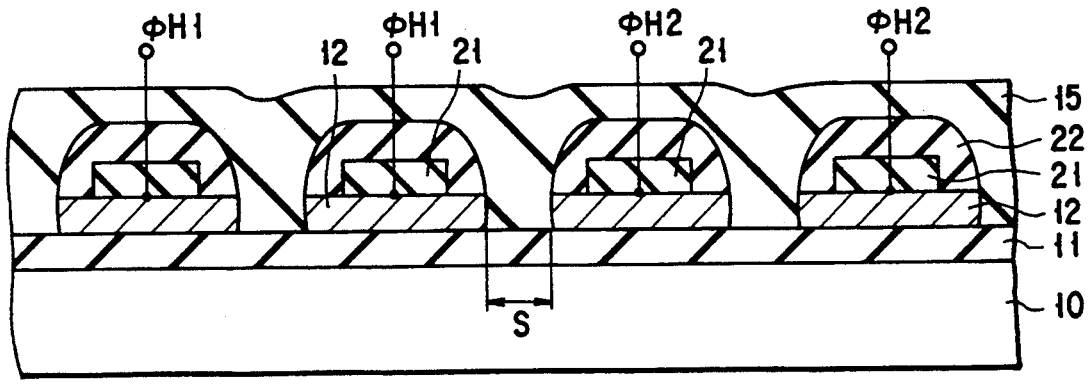

FIGS. 5A and 5B are cross-sectional views showing a vertical CCD and a horizontal CCD of a solid-state imaging device according to another embodiment of the invention. The elements corresponding to those in the preceding embodiments are denoted by the same reference numerals, and a description thereof is omitted.

In this embodiment, both vertical CCD and horizontal CCD comprise dingle-layer polysilicon electrodes 12 patterned by the above-described "side-wall-leaving" technique. The gap R (s) between the electrodes 12 is less than a minimum dimension determined by the lithographic technique and set at, e.g. about 0.2 μm. In the vertical CCD, the polysilicon electrodes 12 constitute a four-phase drive transfer electrode structure. In the horizontal CCD, the polysilicon electrodes 12 constitute a two-phase drive transfer electrode structure. The length of each transfer electrode 12 of the vertical CCD in the direction of transfer is greater than the length of each transfer electrode 12 of the horizontal CCD in the direction of transfer.

Figure 6A:
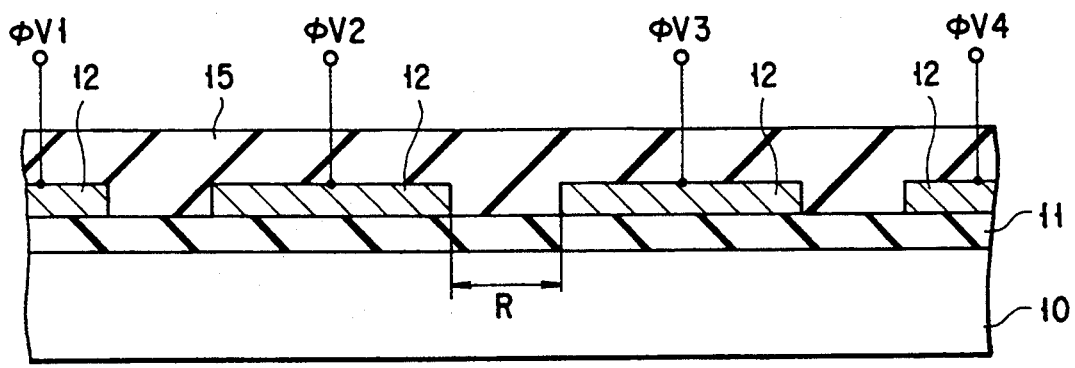
FIGS. 6A and 6B are cross-sectional views showing a vertical CCD and a horizontal CCD of a solid-state imaging device according to another embodiment of the invention.
Figure 6B:
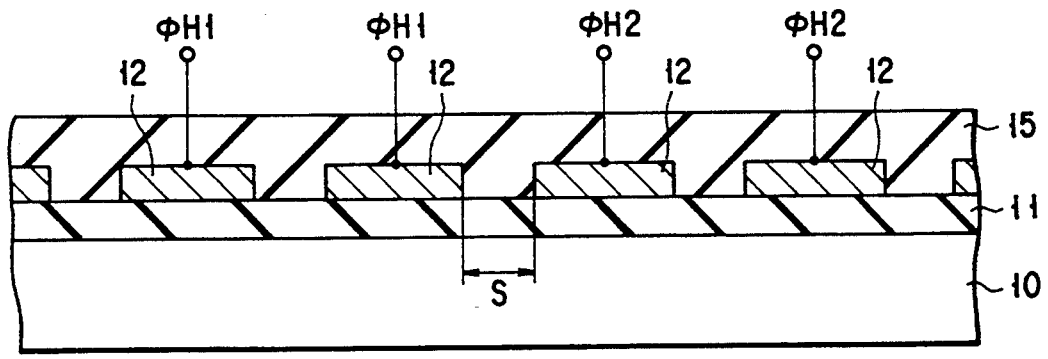

FIGS. 6A and 6B are cross-sectional views showing a vertical CCD and a horizontal CCD of a solid-state imaging device according to another embodiment of the invention. The elements corresponding to those in the preceding embodiments are denoted by the same reference numerals, and a description thereof is omitted.

In this embodiment, the vertical CCD comprises single-layer polysilicon electrodes 12 patterned by RIE, etc. by using lithographic technique. The gap R between the electrodes 12 is set at, e.g. 0.3 μm, or a minimum dimension determined by lithographic techniques recently developed more and more. On the other hand, the horizontal CCD comprises single-layer polysilicon electrodes 12 patterned by utilizing exposure technique called "phase shift process". Thereby, the gap S between the electrodes of the horizontal CCD can be made less than the gap R between the electrodes of the vertical CCD and set at, e.g. about 0.15 μm. The phase shift process is disclosed in, e.g. the following two documents, the teachings of which are hereby incorporated by reference:

(1) "TRANSPARENT PHASE SHIFTING MASK", H. Watanabe, Y. Todokoro, and M. Inoue; CH2865-4/90/000-0821, 1990 IEEE, IEDM 90-821

(2) "FABRICATION OF 64M DRAM WITH i-LINE PHASE-SHIFT LITHOGRAPHY", K. NAKAGAWA, M. TAGUCHI and T. EMA; CH2865-4/90/0000-0817, 1990 IEEE, IEDM 90-817

In the phase shift process, finer processing can be made than in normal lithography. However, owing to a factor such as a defect in material of a phase shifter, it is difficult to produce an exposure mask. In particular, in a solid-state imaging device in which redundancy technique used in a memory is difficult to allow, only a single defect in an exposure mask is not permissible. Thus, manufacture of an exposure mask is very difficult. However, the area to be processed in a horizontal transfer electrode is much less than that in a vertical transfer electrode. Thus, if only the horizontal transfer electrodes are processed by the phase shift process, as in the present embodiment, can the manufacturing yield of exposure masks be increased. Moreover, as compared with the case where the double-layer polysilicon structure is adopted, single-layer CCD solid-state imaging devices with less possibility of inter-polysilicon short circuit can be manufactured with a higher yield.

Figure 7A:
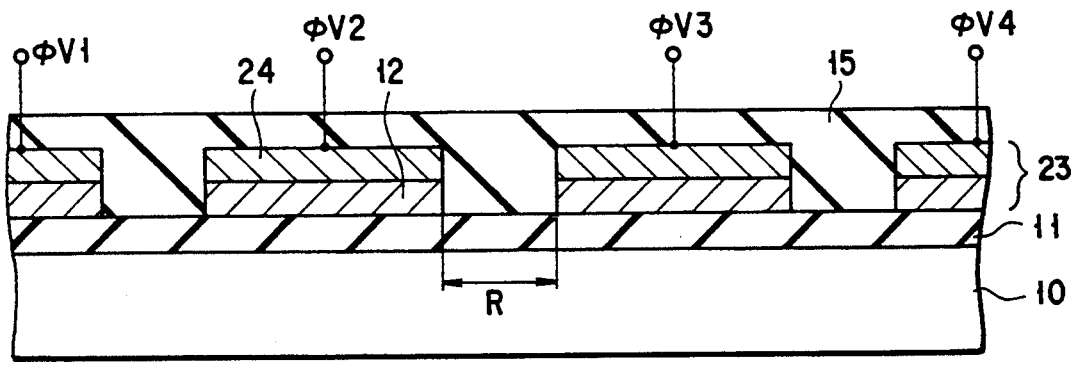
FIGS. 7A and 7B are cross-sectional views showing a vertical CCD and a horizontal CCD of a solid-state imaging device according to another embodiment of the invention.
Figure 7B:
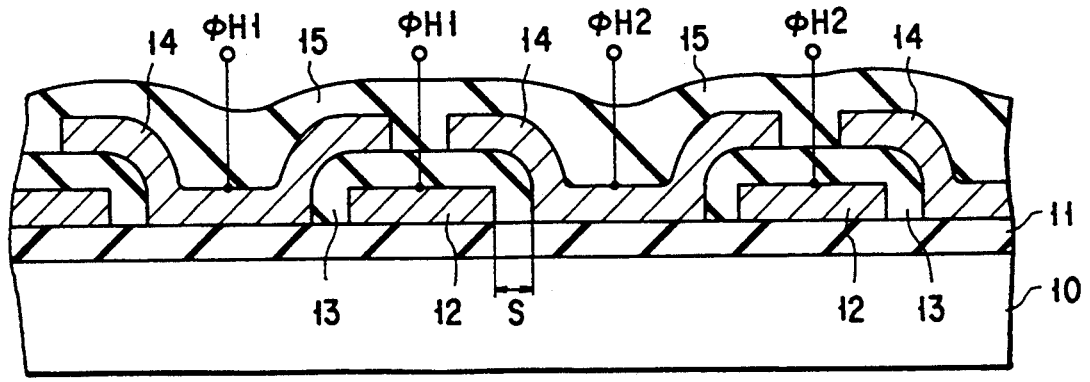

FIGS. 7A and 7B are cross-sectional views showing a vertical CCD and a horizontal CCD of a solid-state imaging device according to another embodiment of the invention. The elements corresponding to those in the preceding embodiments are denoted by the same reference numerals, and a description thereof is omitted.

In this embodiment, the vertical CCD comprises polycide-structure single-layer electrodes 23 patterned by RIE, etc. by using lithographic technique. The single-layer electrode 23 includes a W silicide film 24 and a polysilicon film 12. The gap R between the electrodes is set at, e.g. 0.3 μm, or a minimum dimension determined by lithographic techniques recently developed more and more. On the other hand, the horizontal CCD comprises overlapping double-layer polysilicon electrodes 12 and 14. The gap S between the electrodes 12 and 14 of the horizontal CCD is determined by the thickness of a thermal oxide film 13. The gap S is less than the gap R between the electrodes 12 of the vertical CCD and set at, e.g. about 0.1 μm.

In general, in the single-layer transfer electrode structure, as compared with the overlapping double-layer transfer electrode structure, a coupling capacitance between transfer electrodes is low and there is an advantage in that the CCD driving frequency can easily be increased. In addition, if a low-resistance material is used as electrode material, it is possible to use a still higher driving frequency. For example, if a commonly used polysilicon is replaced with a polycide composition of a polysilicon and W silicide, very excellent frequency characteristics can be attained. In a solid-state imaging device for an HDTV, for example, when a FIT structure is adopted to achieve high image quality, it is difficult to obtain required frequency characteristics with a polysilicon structure. However, if a polycide structure of W silicide is used, the required frequency characteristics can easily be attained.

In this embodiment, the vertical CCD is constituted by single-layer electrodes 23 having films of a low-resistance material such as W silicide. Accordingly, the number of manufacturing steps is small and the possibility of short circuit between electrodes 23 of the vertical CCD is low. Moreover, since the horizontal CCD has an overlapping double-layer structure of polysilicon electrodes 12 and 14, the transfer efficiency is not degraded even if the driving frequency for the horizontal transfer electrodes is increased. For these reasons, solid-state imaging devices can be manufactured with a high yield.

In the embodiment of FIGS. 7A and 7B, the gap between the W silicide films 24, or the upper layers of the polycide electrodes 23, is equal to that between the polysilicon films 12 or the lower layers of the polycide electrodes 23. Normally, after a transfer electrode pattern is formed by etching, oxidation is performed to increase a withstand voltage. However, in general, since the withstand voltage of a film obtained by oxidation of a silicide, in particular, a film made of silicon oxide, is low, the withstand voltage between transfer electrodes may be degraded. In the following embodiments, this problem is solved.

Figure 9:
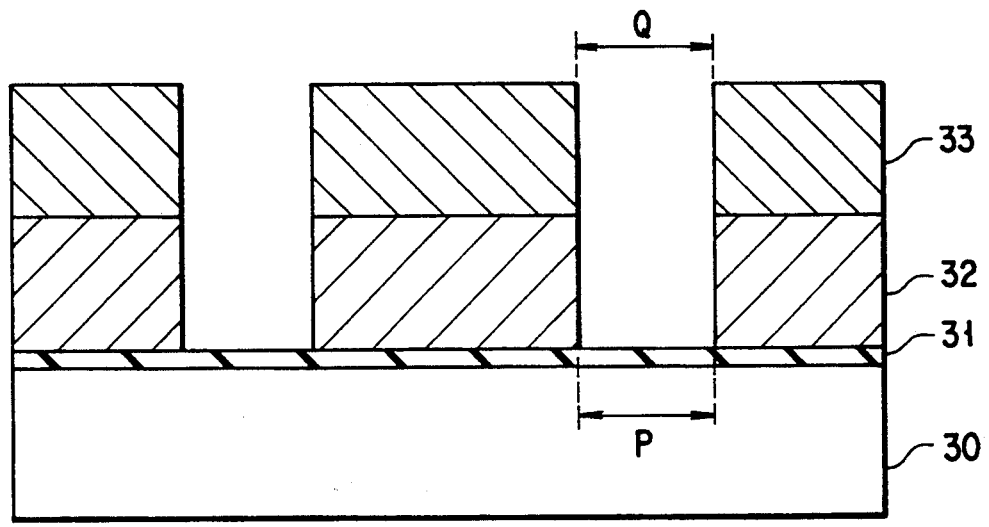
FIG. 9 is a cross-sectional view of a conventional CCD.

FIG. 8 is a cross-sectional view showing a CCD of a solid-state imaging device according to another embodiment of the invention, and FIG. 9 is a cross-sectional view of a conventional CCD shown for the purpose of comparison. Reference numeral 30 denotes a silicon substrate, 31 a gate insulating film, 32 a polysilicon film, and 33 a W silicide film.

In this embodiment, as is shown in FIG. 8, CCD transfer electrodes have a polycide structure. The gap Q between adjacent portions of the silicide film 33 in the direction of signal charge transfer is greater than the gap P between adjacent portions of the polysilicon film 32. Thus, despite the silicide films being used, CCD transfer electrodes with a high withstand voltage can be manufactured with a high yield.

In particular, in a CCD a resistance of transfer electrodes should desirably be as low as possible and a gap between transfer electrodes should desirably be as small as possible in order to obtain a transfer efficiency. According to the solid-state imaging device according to this embodiment, the gap between the CCD transfer electrodes can be decreased without causing a problem of withstand voltage of the oxide films of silicide. Besides, if miniaturization of solid-state imaging devices advances, the aspect ratio of pattern decreases when a pattern is formed by RIE (Reactive Ion Etching). In this respect, too, the present embodiment is useful.

A process of manufacturing the device of this embodiment will now be described with reference to FIGS. 10A to 10C.

Figure 10A:
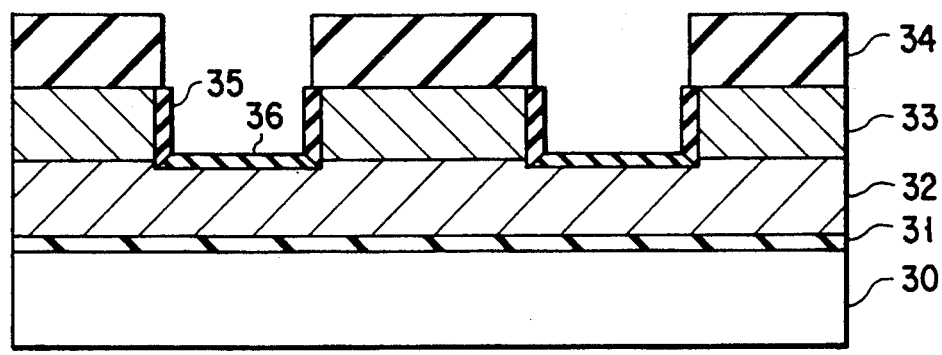
FIGS. 10A to 10C are cross-sectional views showing manufacturing steps of the structure shown in FIG. 8.

As is shown in FIG. 10A, a gate insulating film 31 is formed on a silicon substrate 30. A polysilicon film 32 is formed on the gate insulating film 31 by, e.g. a LPCVD method. A WSi film 33 (silicide) is formed on the polysilicon film 32 by, e.g. sputtering. A silicon oxide film 34 is formed on the WSi film 33 by means of CVD, etc. Furthermore, a resist film is formed on CCD electrode forming areas by a lithographic process, thereby selectively etching the oxide film 34. After the resist film is removed, the WSi film 33 is selectively etched with the oxide film 34 used as a mask. Thereafter, the WSi film 33 is subjected to post-oxidation in order to increase the withstand voltage. Numeral 35 denotes a silicon oxide film formed from WSi, and numeral 36 denotes a silicon oxide film formed from polysilicon.

Figure 10B:
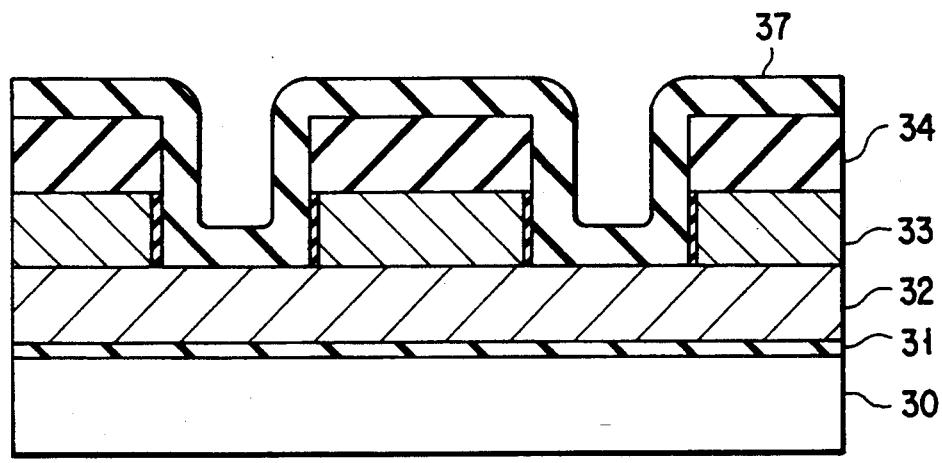

Subsequently, as is shown in FIG. 10B, a CVD oxide film 37 is formed on the entire surface of the resultant structure by means of LPTEOS, etc. Then, as is shown in FIG. 10C, the oxide film 37 is etched to remain on only the side walls of the WSi film 33 and oxide film 34. Thereafter, the polysilicon film 32 is selectively etched with the oxide film 34 and the oxide film 37 on the side walls used as masks. By these steps, the structure as shown in FIG. 8 is obtained, wherein the gap between adjacent portions of the silicide film is greater than the gap between adjacent portions of the polysilicon film.

In the above manufacturing process, WSi is used as the refractory metal silicide, but MoSi, TaSi or TiSi may be used similarly. When WSi is etched, the polysilicon film is not etched. However, the polysilicon film may be etched to some degree simultaneously with the etching of the WSi film. In addition, the oxide film is used as mask when the WSi film is etched. However, the WSi film may be etched directly with a resist film used as a mask, without using the oxide film.

Figure 10C:
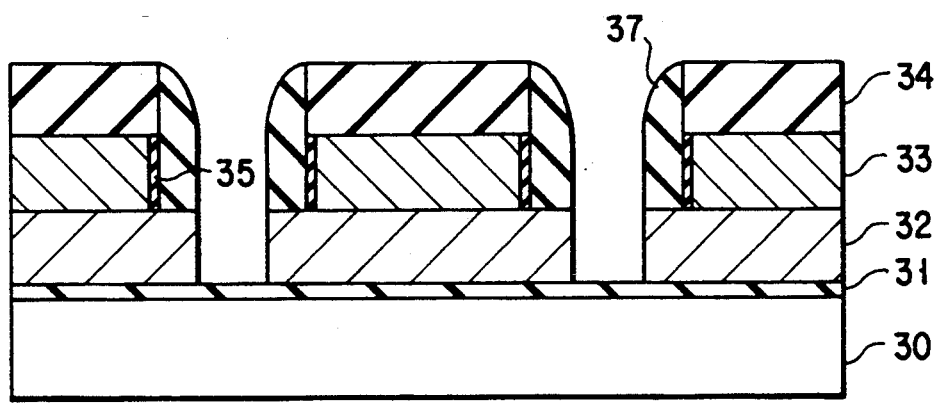
Figure 11A:
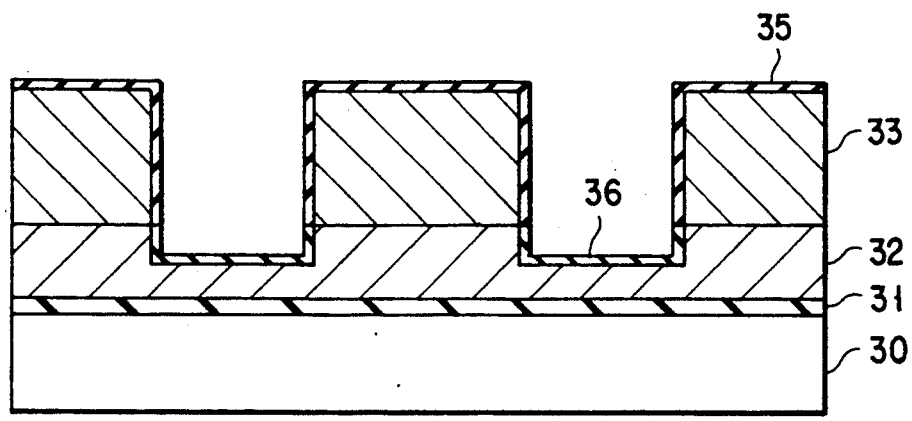
FIGS. 11A to 11C are cross-sectional views showing manufacturing steps of a polycide structure according to another embodiment of the invention.
Figure 11B:
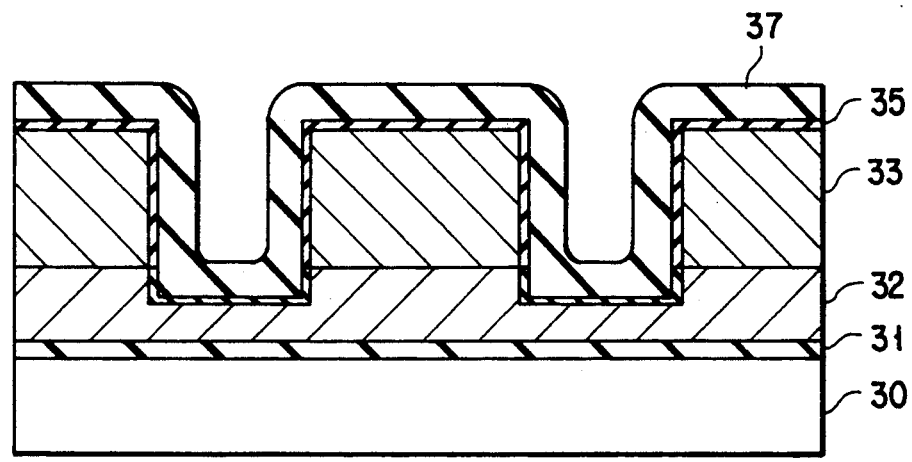
Figure 11C:
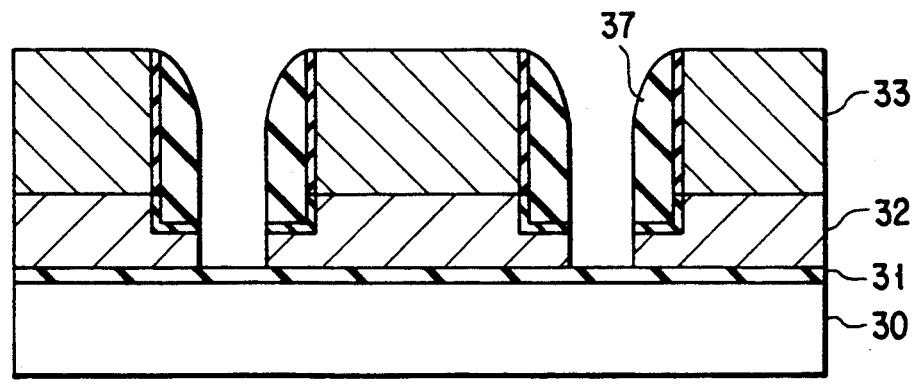

FIGS. 11A to 11C are cross-sectional views showing manufacturing steps of a polycide structure according to another embodiment of the invention. The elements corresponding to those in the embodiment shown in FIGS. 10A to 10C are denoted by the same reference numerals, and a description thereof is omitted.

As is shown in FIG. 11A, a gate insulating film 31 is formed on a silicon substrate 30. A polysilicon film 32 is formed on the gate insulating film 31 by, e.g. LPCVD. A WSi (silicide) film 33 is formed on the polysilicon film 32 by, e.g. sputtering. An oxide film (not shown) is formed on the WSi film 33 by means of CVD, etc. Further, a resist film is formed on CCD electrode formation areas by a lithographic process and the oxide film is selectively etched. After the resist film is removed, the WSi film 33 is selectively etched with the oxide film used as a mask. Thereafter, the oxide film is removed, and the WSi film 33 is subjected to post-oxidation in order to increase the withstand voltage.

Subsequently, as is shown in FIG. 11B, a CVD oxide film 37 is formed by means of LPCVD, etc. Then, as is shown in FIG. 11C, the oxide film 37 is etched to remain on only the side walls of the WSi film 33. Thereafter, the polysilicon film 32 is selectively etched with the oxide film 37 used as a mask.

Thus, the polycide structure wherein the gap between adjacent portions of the silicide film is greater than the gap between adjacent portions of the polysilicon film is obtained, and the same advantages as with the embodiment of FIGS. 10A to 10C can be achieved.

Figure 12A:
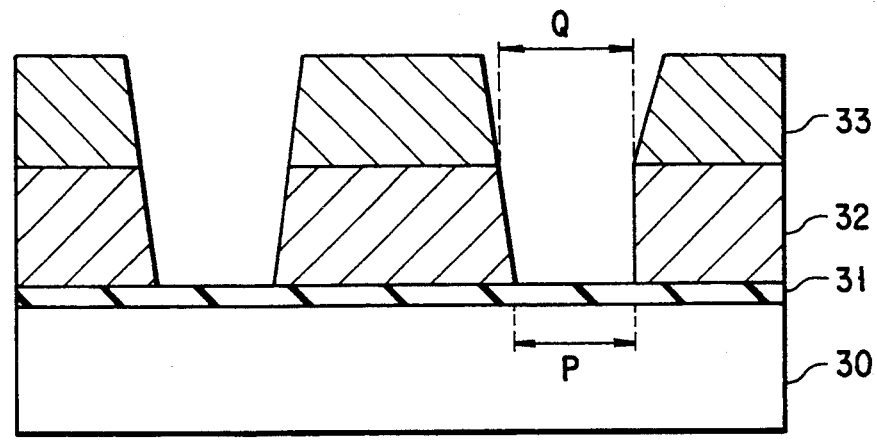
FIGS. 12A to 12C are cross-sectional views showing three examples of a polycide structure according to another embodiment of the invention.
Figure 12B:
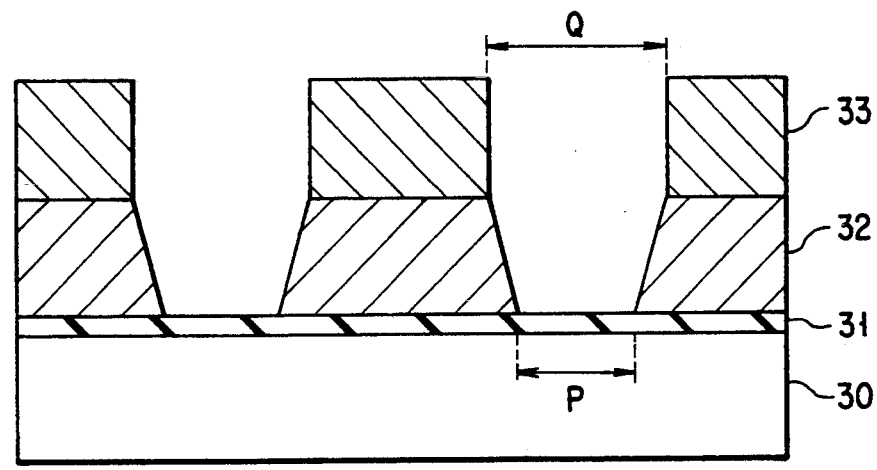
Figure 12C:
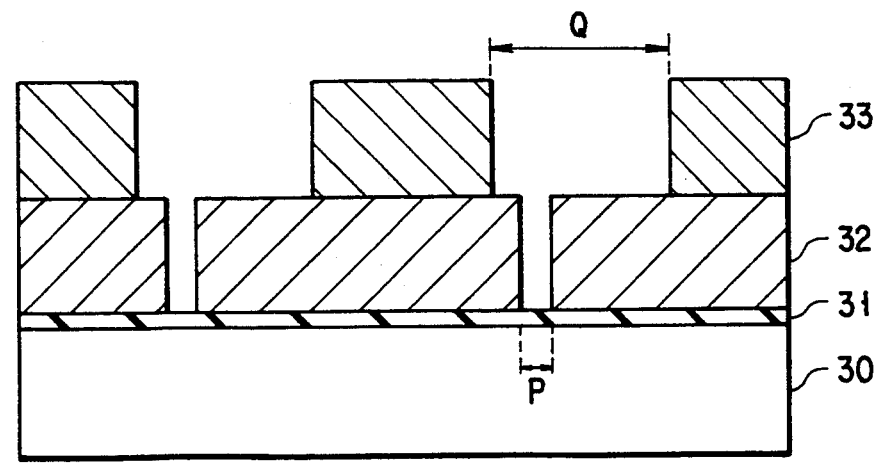

FIGS. 12A to 12C are cross-sectional views showing three examples of a polycide structure according to another embodiment of the invention. The elements corresponding to those in the embodiment shown in FIG. 8 are denoted by the same reference numerals and a detailed description thereof will be omitted.

In the embodiment shown in FIG. 12A, a CCD transfer electrode has a polycide structure, and both silicide film 33 and polysilicon film 32 have tapered structures. The gap Q between adjacent portions of silicide film 33 in the transfer direction is greater than the gap P between adjacent portions of polysilicon film 32. Thus, as with the embodiment shown in FIG. 8, CCD transfer electrodes with a high withstand voltage can be manufactured with a high yield.

In this embodiment, both silicide film 33 and polysilicon film 32 are tapered. However, it is not necessary that both films are tapered. In the embodiment shown in FIG. 12B, a CCD transfer electrode has a polycide structure, and only a polysilicon film 32 as one of silicide film 33 and polysilicon film 32 is tapered. Thereby, the gap Q between portions of silicide film 33 situated adjacent to each other in the direction of transfer is made greater than the gap P between adjacent portions of polysilicon film 32. Thus, as with the embodiment of FIG. 12A, CCD transfer electrodes with high withstand voltage can be manufactured.

In the process illustrated in FIGS. 10A to 10C, the silicide films and polysilicon films are formed by a self-alignment step, but there is no need to form them by a self-alignment step. In FIG. 12C, a CCD transfer electrode has a polycide structure. However, RIE for silicide film and RIE for polysilicon film are not performed by self-alignment. Consequently, the center of the gap between portions of the silicide film does not agree with that of the gap between portions of the polysilicon film. However, since the gap Q between the portions of the silicide films 33 in the direction of transfer is made greater than the gap P between the portions of the polysilicon film 32, CCD transfer electrodes with high withstand voltage can be manufactured with a high yield despite the silicide films being used.

As has been mentioned above, the gap P between portions of the polysilicon film in FIG. 12C needs to be narrow for operation of the CCD. In order to obtain a narrow gap, for example, a phase shift method may be used in a lithography step.

Figure 13:
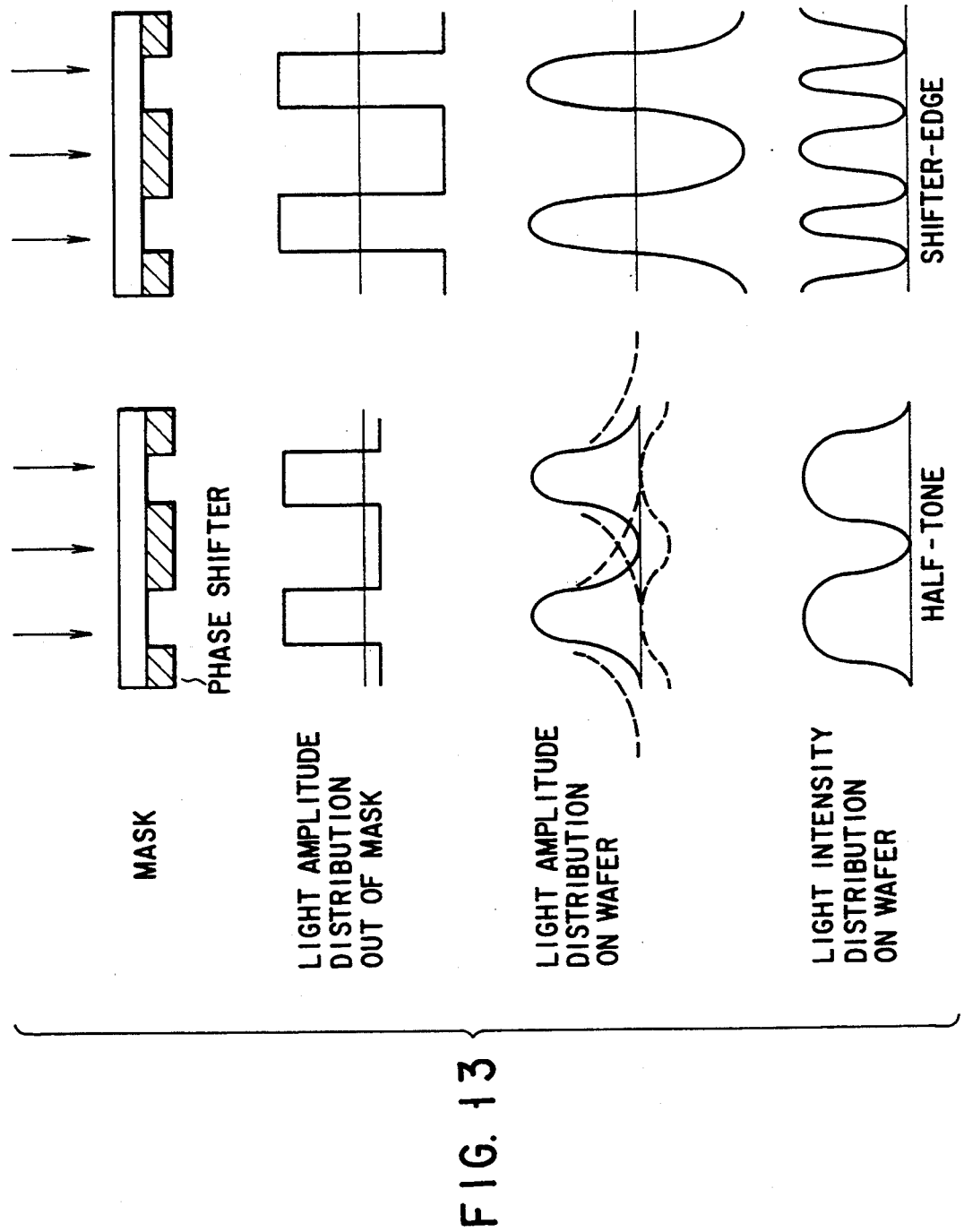
FIG. 13 schematically illustrates the principle of phase shift methods.

FIG. 13 schematically illustrates the principle of phase shift methods. FIG. 13 illustrates a half-tone type phase shift method and a shifter-edge type phase shift method. If the shifter-edge type phase shift method is used, the interference of light can be utilized and a pattern can be formed on a mask with a resolution of a scale less than an exposure light wavelength.

Figure 14A:
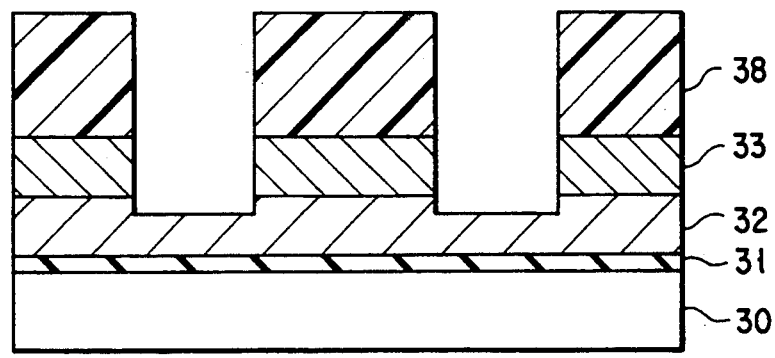
FIGS. 14A to 14D are cross-sectional views illustrating manufacturing steps of a solid-state imaging device by use of a phase shift method.

FIGS. 14A to 14D are cross-sectional views illustrating manufacturing steps of a solid-state imaging device by use of a phase shift method illustrated in FIG. 13. At first, as is shown in FIG. 14A, a gate insulating film 31 is formed on a silicon substrate 30. A polysilicon film 32 is formed on the gate insulating film 31 by, e.g. LPCVD, and a WSi (silicide) film 33 is formed on the polysilicon film 32 by, e.g. sputtering. Further, a positive resist film 38 is formed on CCD electrode forming areas by lithography, and a WSi film 33 is selectively etched. In this case, over-etching is performed to provide an allowance to the process and as a result the polysilicon film 32 is etched more or less.

Figure 14B:
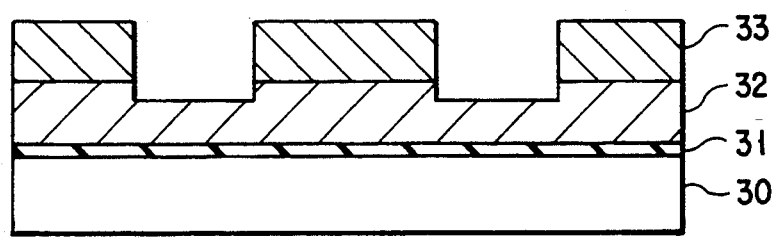
Figure 14C:
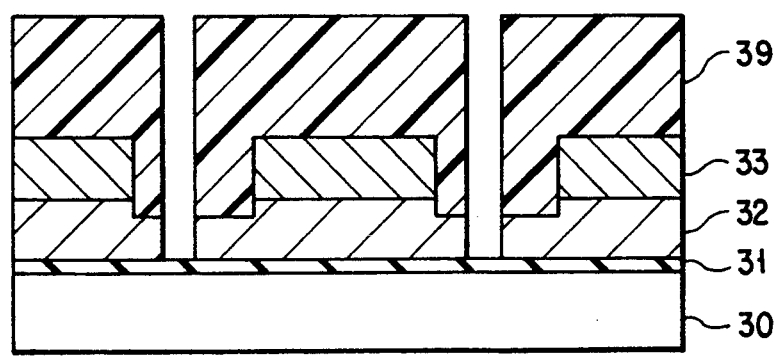
Figure 14D:
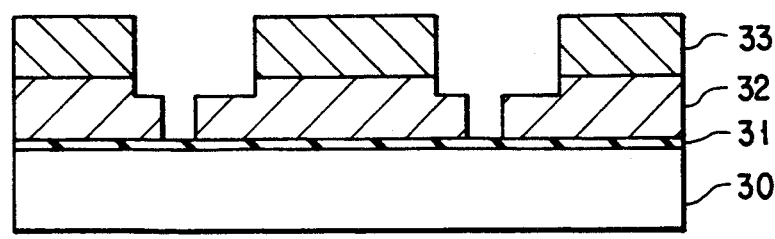

Subsequently, the resist film 38 is removed, as shown in FIG. 14B, and a negative resist film 39 is patterned, as shown in FIG. 14C, by using the shifter-edge phase shift method so as to provide a narrow space less than an exposure light wavelength. Then, the polysilicon film 32 is selectively etched with the negative resist film 39 used as a mask. The resist film 39 is removed and the structure as shown in FIG. 14D is obtained.

According to this manufacturing process, the polysilicon film 32 is patterned by the shifter-edge phase shift method. However, a Levenson type phase shift method may be used. It is difficult to apply the Levenson type phase shift method to a device with an irregular pattern. In the case of a polysilicon electrode of a CCD solid-state imaging device, however, a wiring pattern is simple. Therefore a problem relating to an irregular pattern of a decoder, which is significant in a semiconductor memory device, can be easily solved.

Figure 15A:
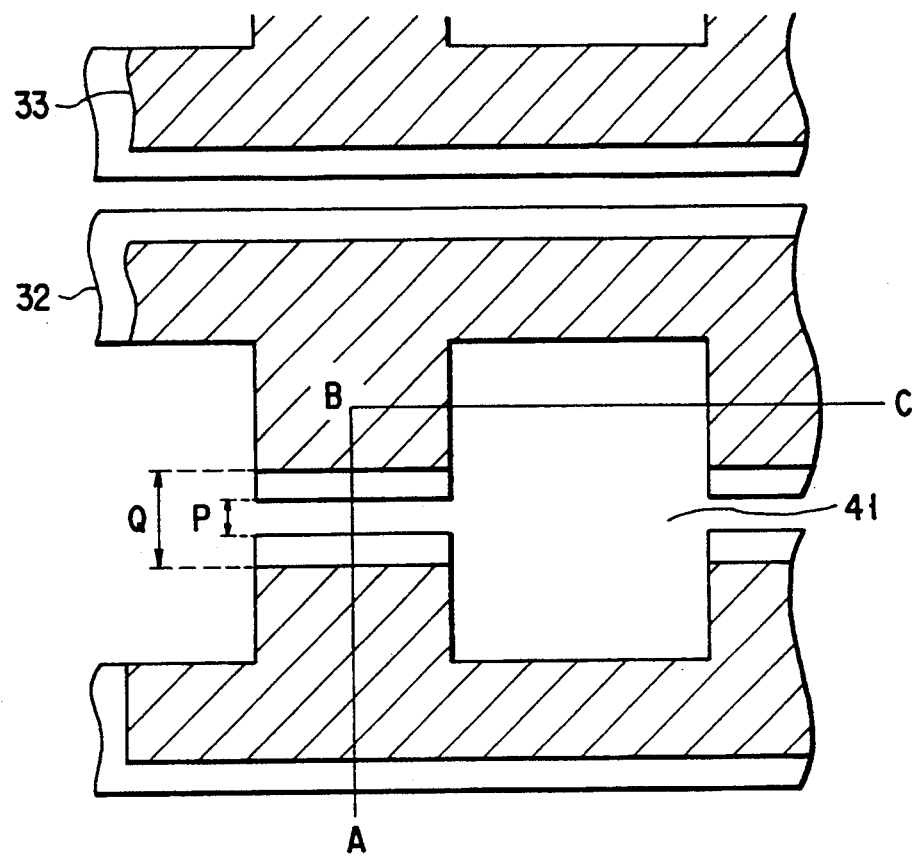
FIGS. 15A and 15B are a plan view and a cross-sectional view showing a light-receiving section of a solid-state imaging device according to another embodiment of the invention.

FIG. 15A is a plan view of a light-receiving section of a solid-state imaging device according to the present invention. Silicide films are formed in areas indicated by hatched lines. In this embodiment, in a light-receiving section 41, the edge of a pattern of a silicide film 33 alings with that of a pattern of a polysilicon film 32. As regards the gap between CCD transfer electrodes, since the present invention is applied, the gap P between adjacent portions of silicide film is greater than the gap Q between adjacent portions of polysilicon film.

Figure 15B:
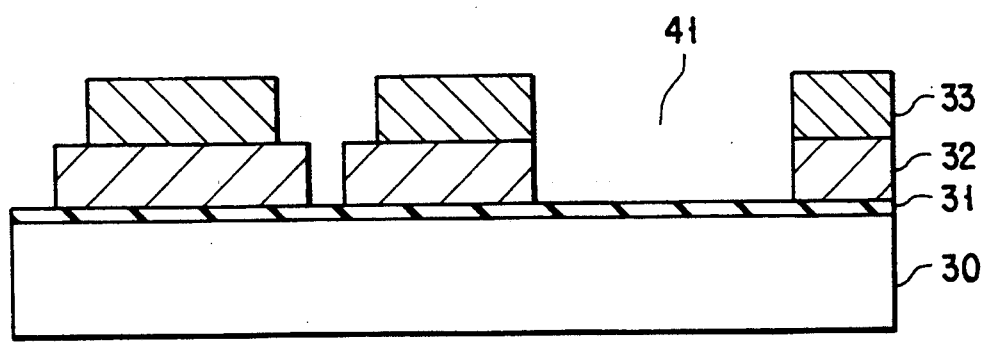

FIG. 15B is a cross-sectional view taken along line A-B-C in FIG. 15A. Since in the light-receiving section 41 the edge of the pattern of silicide film 33 alings with that of the pattern of polysilicon film 32, opening ratio can be increased. Accordingly, solid-state imaging devices with good sensitivity can be manufactured with a high yield.

FIGS. 16A to 16C are cross-sectional views illustrating the manufacturing steps of this embodiment. At first, a gap between CCD transfer electrodes is formed according to the manufacturing steps shown in FIGS. 10A to 10C. This state is shown in FIG. 16A. Then, as is shown in FIG. 16B, a light-receiving section is patterned by lithography with use of a resist film 42, and an oxide film 34, a silicide film 33 and a polysilicon film 32 are selectively etched. Subsequently, the resist film 42 is removed, as shown in FIG. 16C.

According to the present embodiment, with respect to the CCD transfer electrodes of the polycide structure, the gap between the silicide portions is made greater than the gap between the polysilicon portions. Thereby, polycide-structure CCD transfer electrodes with improved withstand voltage can be formed and low-smear solid-state imaging devices can be manufactured with a high yield.

The structures described with reference to FIGS. 8 to 16C are not limited to CCD electrodes of solid-state imaging devices and are applicable to various electrodes of polycide structures.

Another embodiment of the invention will now be described with reference to FIGS. 17A to 17F.

There is known a method of processing CCD transfer electrodes, which is described below. At first, a PSG film is formed on a film to be processed such as a polysilicon film or a Al film. A groove is formed in the PSG film, and a silicon oxide film is deposited by plasma CVD. The entire surface of the silicon oxide film is etched with ammonium fluoride liquid. Thus, a groove narrower than the groove in the PSG film is formed in the silicon oxide film. With these films used as masks, the film to be processed is selectively etched. In this case, however, it is troublesome to finally remove the films (PSG and silicon oxide films) used as masks for forming the narrower groove.

In this embodiment, this problem has been solved. FIGS. 17A to 17F are cross-sectional views illustrating the manufacturing steps of a device according to an embodiment of the invention wherein an Al wiring pattern is formed. At first, as is shown in FIG. 17A, a silicon oxide film 52 serving as an interlayer insulating film is formed on a silicon substrate 51 by a vapor phase growth method, etc. An Al film (a film to be processed) 53 is formed on the silicon oxide film 52 by, e.g. sputtering. Then, a silicon oxide film 54 is formed by, e.g. a vapor phase growth method, and a silicon nitride film 55 is formed by, e.g. a vapor phase growth method. A resist film 56 is formed on Al wiring formation areas by a lithography step.

Subsequently, as is shown in FIG. 17B, with the resist film 56 used as a mask, the silicon nitride film 55 is selectively etched by RIE, and grooves 58 are formed in the silicon nitride film 55. After the resist film 56 is removed, a silicon nitride film 57 is deposited on the resultant by, e.g. a vapor phase growth method.

Then, the entire surface of the silicon nitride film 57 is etched by RIE. Since the silicon nitride film 57 is thinner at central portions of the grooves 58, narrow grooves 59 are formed at central portions of the grooves 58, as shown in FIG. 17C.

With the silicon nitride film 57 used as a mask, the silicon oxide film 54 is selectively etched by, e.g. RIE, and grooves 60 having almost the same width as the grooves 59 are formed in the silicon oxide film 54, as shown in FIG. 17D.

Subsequently, the silicon nitride film 55 and silicon nitride film 57 are removed, as shown in FIG. 17E, by using, e.g. an RIE technique which offers a selection ratio in relation to the silicon oxide film 54. The resultant structure is etched by, e.g. RIE, with the silicon nitride film 54 used as a mask, and an Al wiring pattern is formed, as shown in FIG. 17F.

According to this embodiment, a wiring gap can be reduced without varying a pitch of Al wiring formed of the Al film 53. Thereby, the integration density of the Al wiring pattern can be increased. Moreover, the silicon nitride film 55 and silicon nitride film 57 used in the manufacturing steps can be easily removed. For example, when another wiring pattern is formed in a subsequent step, the possibility of defects due to breakage at stepped wiring portions can be reduced since the stepped portions are small. Therefore, highly reliable products can be manufactured with a high yield.

In other words, a fine groove of a size less than a fine pattern minimum dimension determined by ordinary lithography can be formed, and the thick material films used as masks in forming narrow grooves in the above-mentioned step can be completely removed after the fine pattern is formed. Thus., when this technique is applied to the wiring pattern formation, a wiring width can be increased without varying a wiring pitch. Further, when an integration density is increased, the amount of stepped portion is reduced after wiring formation. In a subsequent step, a pattern formation is facilitated. Accordingly, reliability is enhanced and a yield of devices is increased.

Figure 18A:
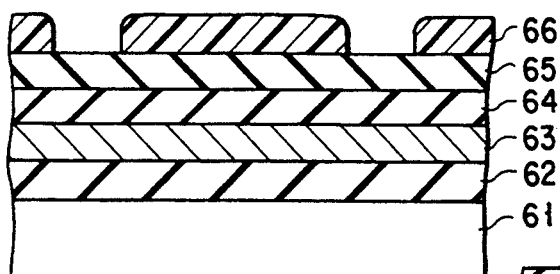
FIGS. 18A to 18F are cross-sectional views illustrating manufacturing steps of a structure according to another embodiment of the invention.

FIGS. 18A to 18F are cross-sectional views illustrating the manufacturing steps of forming an electrode pattern of a solid-state imaging device having a single-layer electrode CCD, according to another embodiment of the present invention. At first, as is shown in FIG. 18A, a silicon oxide film 62 serving as an interlayer insulating film is formed on a silicon substrate 61 by a vapor phase growth method, etc. A polysilicon film 63 is formed on the silicon oxide film 62 by, e.g. a vapor deposition. Then, a silicon nitride film 64 is formed by, e.g. a vapor phase growth method, and a silicon oxide film 65 is formed. A resist film 66 is formed on polysilicon electrode pattern formation areas by a lithography step.

Figure 18D:
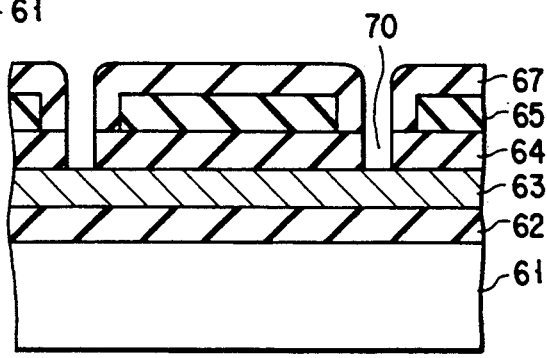
Figure 18B:
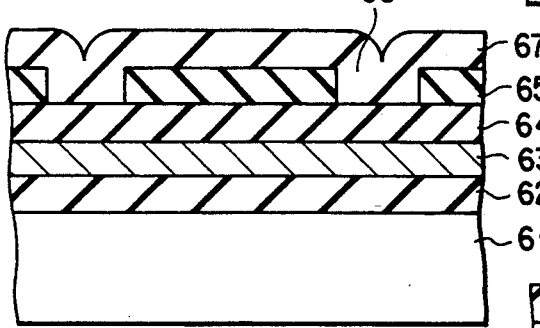

Subsequently, as is shown in FIG. 18B, with the resist film 66 used as a mask, the silicon oxide film 65 is selectively etched by RIE, and grooves 68 are formed in the silicon oxide film 65. After the resist film 66 is removed, a silicon oxide film 67 is deposited on the resultant by, e.g. a vapor phase growth method.

Then, the entire surface of the silicon oxide film 67 is etched by, e.g. RIE. Since the silicon oxide film 67 is thinner at central portions of the grooves 68, narrow grooves 69 narrower than the grooves 68 are formed at central portions of the grooves 68, as shown in FIG. 18C.

With the silicon oxide film 67 used as a mask, the entire surface of the silicon nitride film 64 is etched by, e.g. RIE, and grooves 70 having almost the same width as the grooves 69 are formed in the silicon nitride film 64, as shown in FIG. 18D.

Figure 18E:
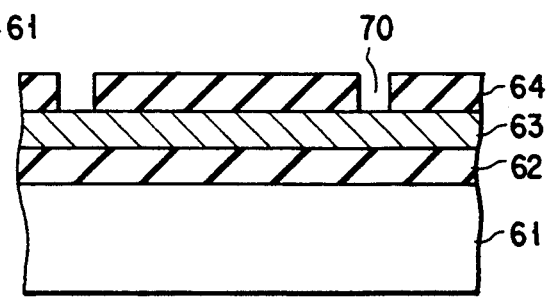
Figure 18C:
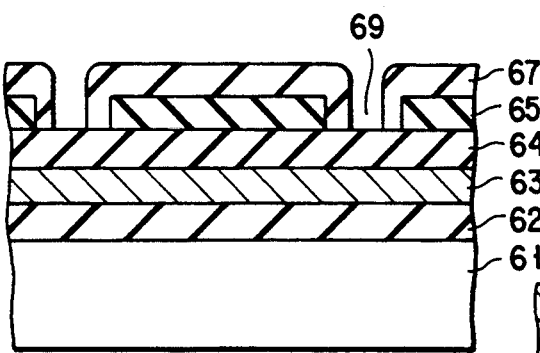
Figure 18F:
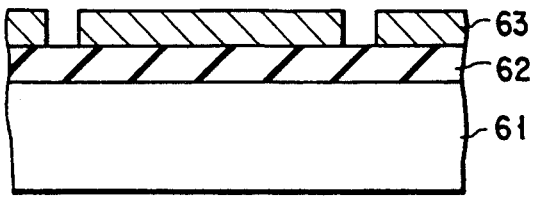

Subsequently, the silicon oxide film 65 and silicon oxide film 67 are removed, as shown in FIG. 18E, by using, e.g. an RIE technique which offers a selection ratio in relation to silicon nitride. The resultant structure is etched by, e.g. RIE, with the silicon nitride film 64 used as a mask, and a polysilicon electrode pattern is formed, as shown in FIG. 18F.

According to this embodiment, an electrode gap can be reduced without varying a pitch of polysilicon electrodes formed of the polysilicon film 63. Thereby, the integration density of the polysilicon electrode pattern can be increased. Moreover, the silicon oxide film 65 and silicon oxide film 67 used in the manufacturing steps can be easily removed. When a light-shield film pattern is formed in a subsequent step, the possibility of defects due to step breakage at stepped portions of the light-shield film can be reduced since the stepped portions are small. Therefore, highly reliable solid-state imaging devices with low possibility of error signals can be manufactured with a high yield.

Figure 19:
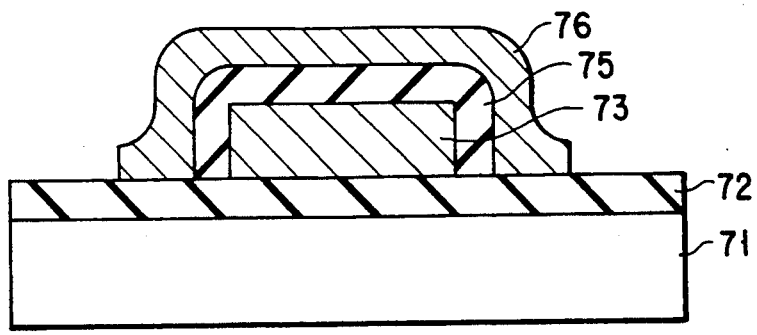
FIG. 19 is a cross-sectional view showing a solid-state imaging device having a single-layer electrode CCD formed by a method of the present invention.
Figure 20:
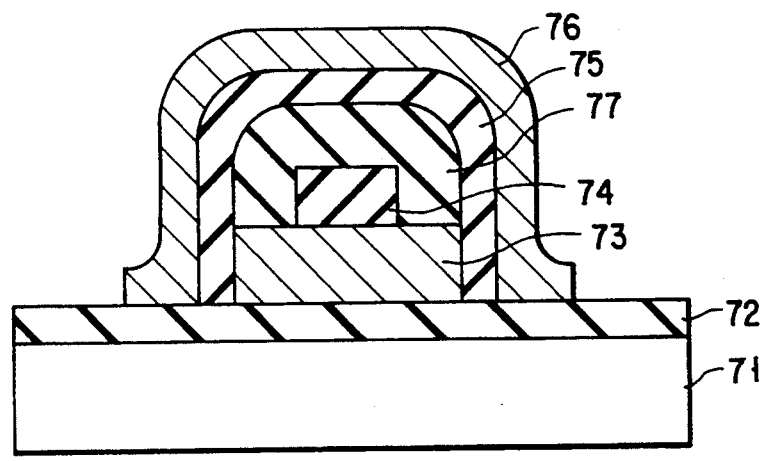
FIG. 20 is a cross-sectional view showing a solid-state imaging device having a conventional single-layer electrode CCD.

FIG. 19 is a cross-sectional view showing a solid-state imaging device having a single-layer electrode CCD formed by the method of the present invention, and FIG. 20 is a cross-sectional view showing a solid-state imaging device having a conventional single-layer electrode CCD. Reference numeral 71 denotes a silicon substrate, 72 a gate insulating film, 73 a polysilicon film (CCD electrode), 74 a PSG film, 75 a silicon oxide film (interlayer insulating film), 76 an Al film (light-shield film), and 77 a silicon oxide film.

In the prior art, as shown in FIG. 20, thick layers 74 and 77 remain on the electrode pattern after the electrode pattern 73 is formed. Thus, when the electrode is covered with the Al light-shield film 76, the height of the stepped portion is great, and a defect such a stepping breakage at the stepped portion of the light-shield film may occur easily.

On the other hand, according to the present invention, the mask material can be removed. Thus, as shown in FIG. 19, no thick layer remains on the electrode pattern after the electrode pattern 73 is formed. Accordingly, even when the electrode is covered with the Al light-shield film 76, the height of the stepped portion is lower than in the prior art and a defect such a stepping breakage at the stepped portion of the light-shield film may not occur easily.

Figure 21:
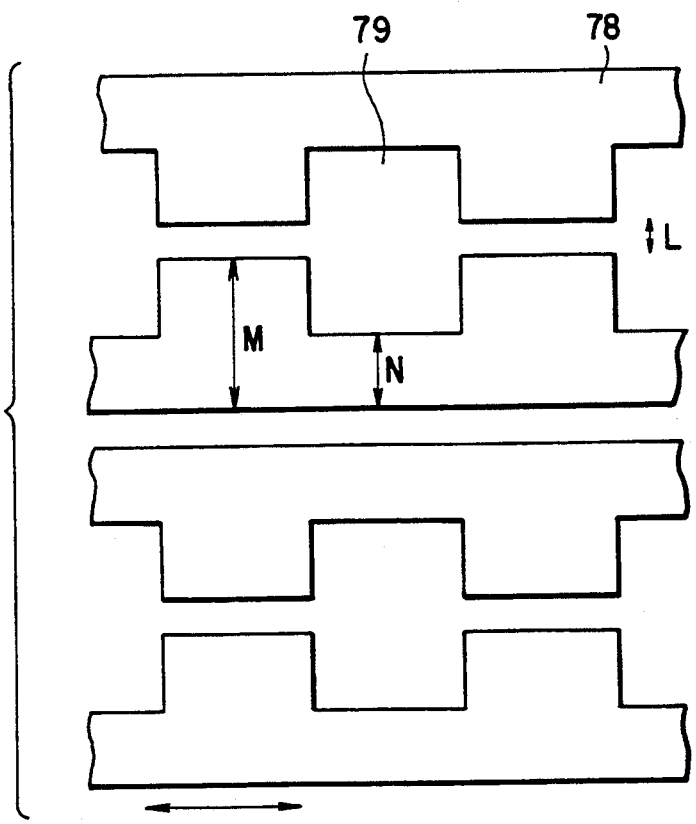
FIG. 21 is a typical plan view of a solid-state imaging device having a single-layer electrode CCD.

FIG. 21 is a typical plan view of a solid-state imaging device having a single-layer electrode CCD. Reference numeral 78 denotes a CCD electrode and numeral 79 a light-receiving section. In general, in a CCD solid-state imaging device, a plan-view pattern of an imaging section has a width M or N of an electrode which is greater than an inter-electrode distance L, as shown in FIG. 21. Therefore, the present invention wherein an inter-electrode distance less than a minimum pattern dimension determined by lithography can be obtained is very effective.

The embodiments described with reference to FIGS. 17A to 21 are not limited to CCDs of solid-state imaging devices, and are applicable to electrode pattern formation having a very small gap.

A process according to another embodiment of the present invention will now be described with reference to FIGS. 22A to 22J.

When a two-phase drive CCD is formed in a single-layer electrode structure, impurity ions are implanted to produce a potential-difference portion after a CCD channel portion is formed. Thereafter, a transfer gate is formed by patterning. At this time, alignment of the potential-difference portion and transfer electrode is important. Specifically, misalignment of the potential-difference portion and transfer electrode results in a potential pocket or a barrier under the electrode and the transfer efficiency is degraded. Moreover, when a single-layer electrode is formed, a fine lithographic technique is indispensable to reduce an inter-electrode gap to 0.3 μm or less. In order to produce the space of this size, patterning by an excimer laser or an electron beam is required, but this patterning is not suitable for mass-production.

Figure 22A:
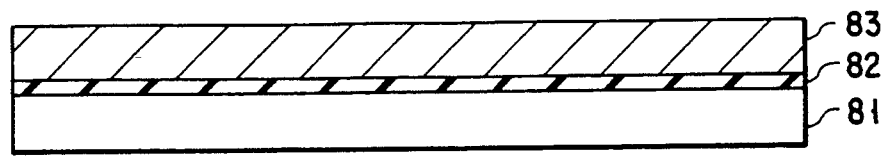
FIGS. 22A to 22J are cross-sectional views illustrating manufacturing steps of a structure according to another embodiment of the invention.

In this embodiment, this problem is solved. FIGS. 22A to 22J are cross-sectional views illustrating a manufacturing process of a CCD of a solid-state imaging device according to this embodiment of the invention. At first, as is shown in FIG. 22A, a photoelectric conversion section and a signal charge transfer section (not shown) are formed on a semiconductor substrate 81. Thereafter, a first polysilicon film 83 is deposited by CVD to a thickness of 100 to 600 nm with a gate insulating film 82 interposed.

Figure 22B:
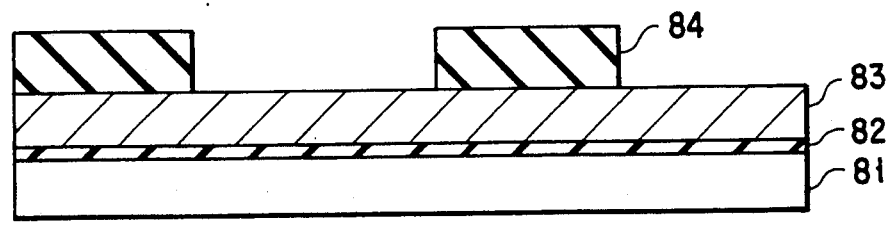

Subsequently, as is shown in FIG. 22B, an $SiO_2$ film 84 is deposited on the polysilicon film 83 by, e.g. CVD to a thickness of 100 to 600 nm. With a photoresist film (not shown) patterned by a photo-etching step used as a mask, the CVD-$SiO_2$ film 84 is etched.

Figure 22C:
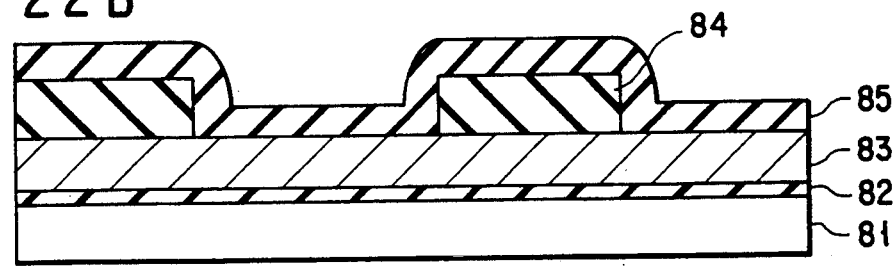
Figure 22D:
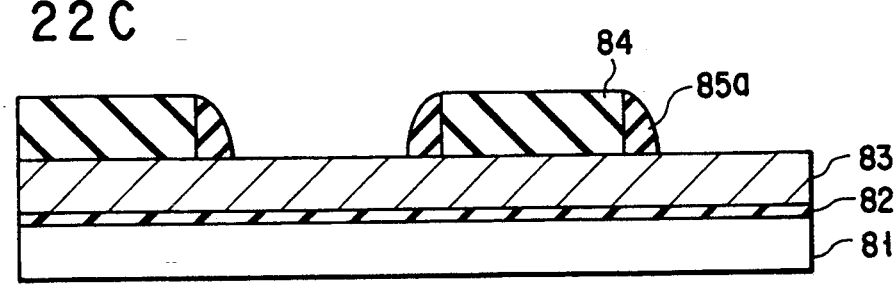

Then, as is shown in FIG. 22C, the photoresist film is removed and a third thin film or a SiN film 85 is deposited on the resultant to a thickness of 100 to 400 nm. The thickness of the SiN film 85 is determined in consideration of a desired final inter-electrode gap. Following this, the SiN film 85 is subjected to anisotropic etching, as shown in FIG. 22D. By appropriately choosing the degree of etching, a thin SiN film 85 a is left on side walls of the CVD-$SiO_2$ film 84.

Figure 22E:
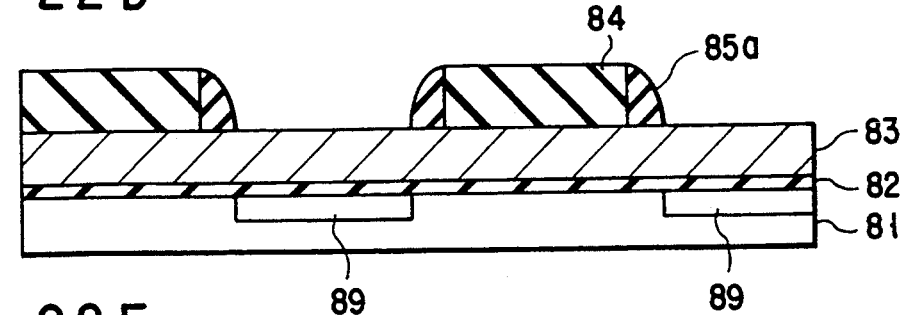

In this state, phosphorus (P), for example, is ion-implanted in the entire surface of a channel portion with a high acceleration of 500 KeV to 1 MeV. The acceleration of ion implantation is determined in consideration of a film thickness of polysilicon and/or a desired depth of a diffusion layer. By the ion-implantation at the high acceleration, ions permeate into the polysilicon but $SiO_2$ and SiN block the ions. Thus, as is shown in FIG. 22E, a diffusion layer 89 can be formed within the substrate by self-alignment.

Figure 22F:
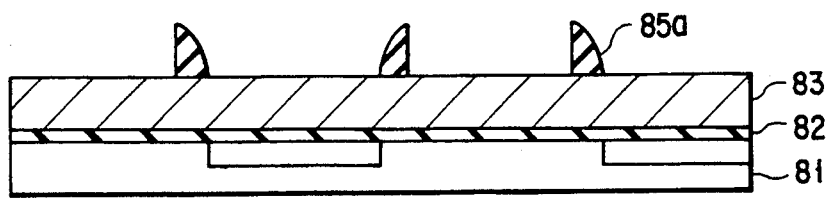
Figure 22G:
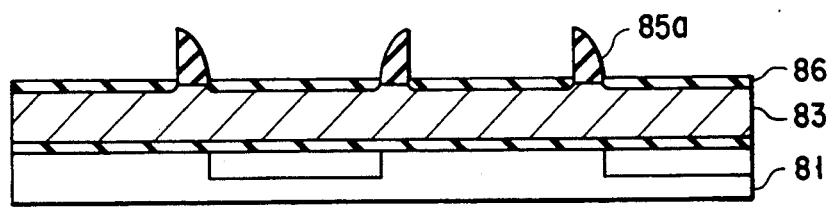
Figure 22H:
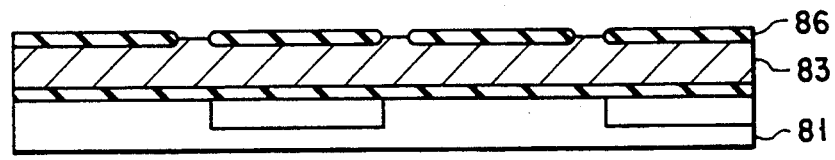
Figure 22I:
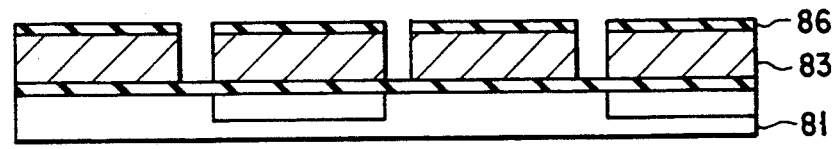
Figure 22J:
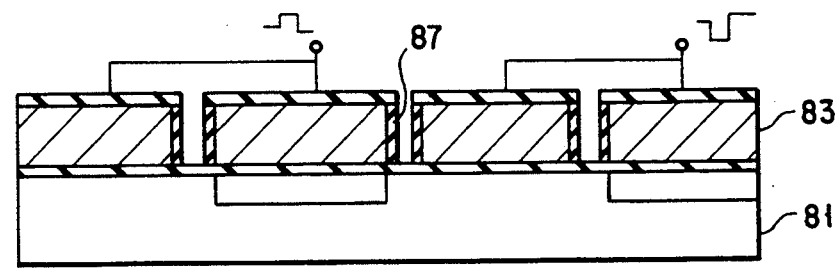
Figure 23A:
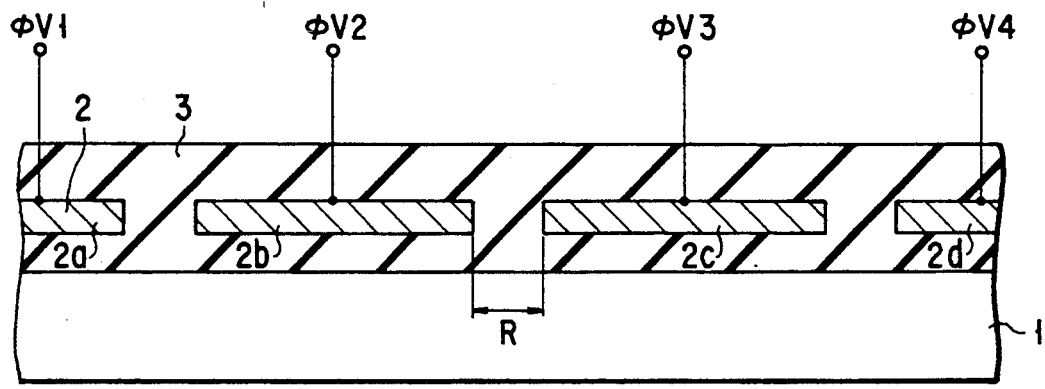
FIGS. 23A and 23B are cross-sectional views showing a vertical CCD and a horizontal CCD of a solid-state imaging device of a conventional single-layer electrode CCD.
Figure 23B:
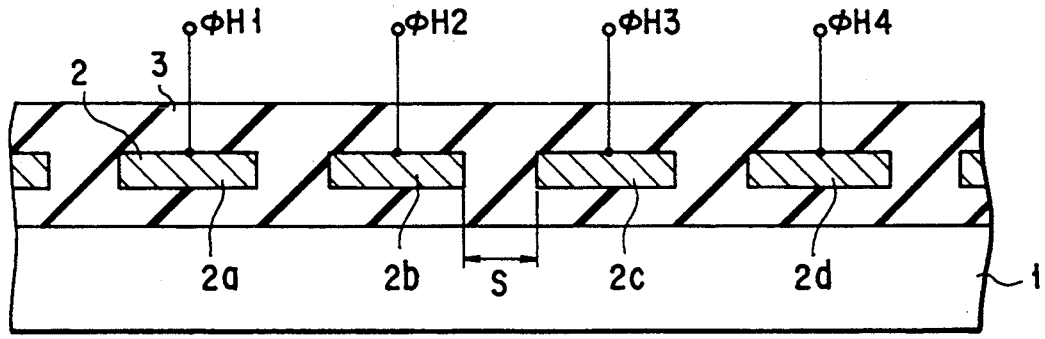
Figure 24A:
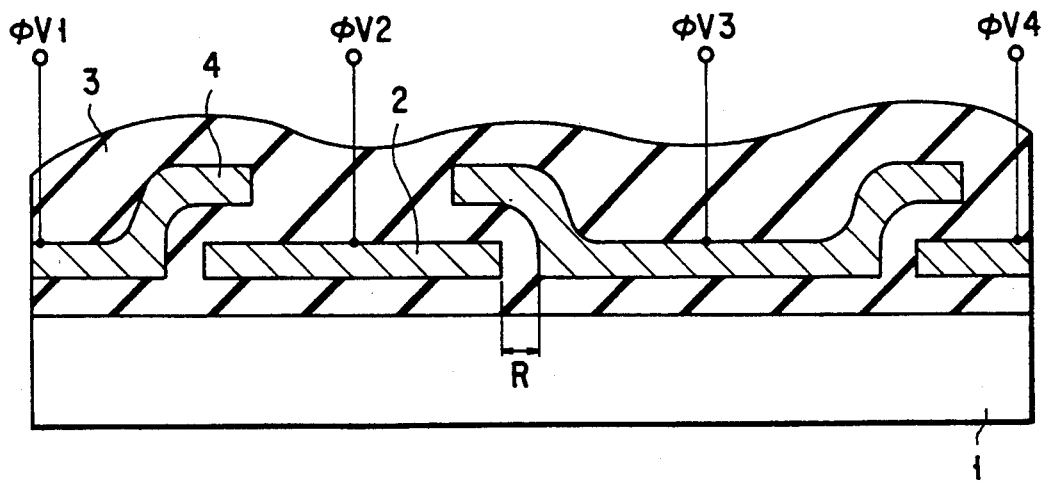
FIGS. 24A and 24B are cross-sectional views showing a vertical CCD and a horizontal CCD of a solid-state imaging device of a conventional overlapping double-layer electrode CCD.
Figure 24B:
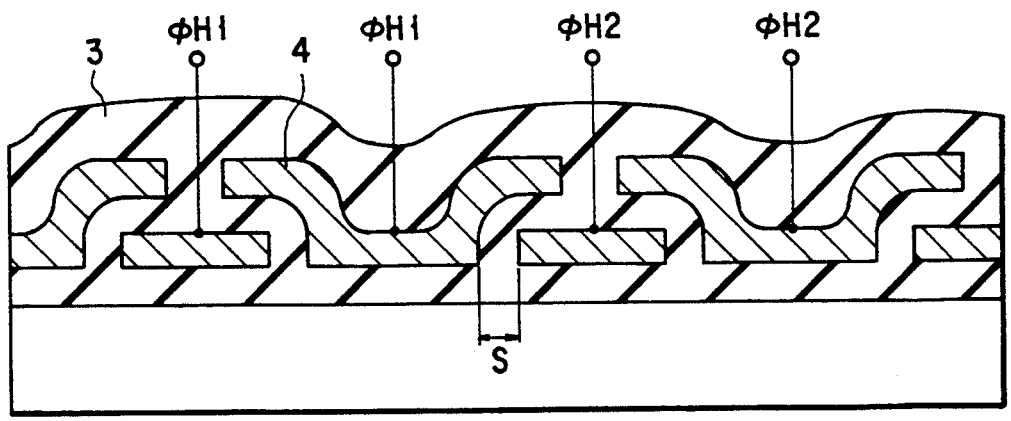

The $SiO_2$ film 84 is then etched away with use of $NH_4F$, as shown in FIG. 22F. In this state, using the remaining SiN film 85a as a mask, an oxide film 86 is formed on the polysilicon film 83 by selective oxidation, as shown in FIG. 22G. Subsequently, the SiN film 85a is etched away, as shown in FIG. 22H, and the polysilicon film 83 is patterned by anisotropic etching, as shown in FIG. 22I. At last, an oxide film is grown on the cut portions of the film 83 and a single-layer electrode CCD is obtained, as shown in FIG. 22J.

According to this embodiment, since a potential-difference portion is formed by self-alignment for each transfer electrode, a decrease in transfer efficiency due to misalignment is low. Furthermore, an inter-electrode gap can be formed so as to substantially correspond to the thickness of the third thin film.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A solid-state imaging device comprising:
   a plurality of photoelectric conversion sections arranged two-dimensionally on a semiconductor substrate;
   a plurality of vertical CCDs each arranged adjacent a respective column of said photoelectric sections in side-by-side relation for vertically transferring signal charges read out from said photoelectric conversion sections, each vertical CCD including a plurality of transfer electrodes arranged in a first direction with a first gap across which charge is transferred present between adjacent ones along a first charge transfer path in the first direction; and
   a horizontal CCD connected to said vertical CCDs and extending in a second direction which intersects said first direction, for receiving the signal charges transferred by said vertical CCDs and transferring received signal charges in said second direction, said horizontal CCD including a plurality of transfer electrodes arranged with a second gap present between adjacent ones along a second charge transfer path in said second direction, said second gap being less than said first gap.

2. The device according to claim 1, wherein each of said transfer electrodes of said vertical CCDs or said horizontal CCD has a polycide structure in which a polysilicon layer and a refractory metal silicide layer are laminated.

3. The device according to claim 2, wherein said polysilicon layer and said refractory metal silicide layer are formed, respectively, of segments of a polysilicon film and a refractory metal silicide film divided in accordance with said transfer electrodes.

4. The device according to claim 2, wherein a distance between said silicide layers of said polycide-structure transfer electrodes is greater than a distance between said polysilicon layers of the polycide-structure transfer electrodes along the respective charge transfer paths.

5. The device according to claim 1, wherein said transfer electrodes of said vertical CCDs comprise first segments of a first polysilicon film divided as said transfer electrodes, said transfer electrodes of said horizontal CCD comprise second segments of said first polysilicon film divided as alternate ones of said transfer electrodes and segments of a second polysilicon film divided as electrodes between said alternate ones of said transfer electrodes, each segment of said second polysilicon film having end portions extending above adjacent two of said second segments of said first polysilicon film along the second charge transfer path, and said second gap is determined by a silicon oxide film obtained by subjecting said second segments of said first polysilicon film to thermal oxidation.

6. The device according to claim 5, further comprising first and second insulating layers provided in this order on the respective transfer electrodes of said vertical CCDs, wherein the length of said first insulating layer is less than the length of each of the transfer electrodes along the first charge transfer path, and the center of the length of the first insulating layer coincides substantially with the center of the length of the transfer electrode, and said second insulating layer covers said first insulating layer and both ends thereof align substantially with both ends of each of said transfer electrodes along the first charge transfer path.

7. The device according to claim 6, wherein said first and second insulating layers are formed respectively of segments of first and second insulating films divided in accordance with said transfer electrodes.

8. The device according to claim 1, wherein said transfer electrodes of said vertical CCDs comprise first segments of a first polysilicon film divided as said transfer electrodes, and said transfer electrodes of the horizontal CCD comprise second segments of the first polysilicon film divided as said transfer electrodes.

9. The device according to claim 8, further comprising first and second insulating layers provided in this order on the respective transfer electrodes of said horizontal CCD, wherein the length of said first insulating layer is less than the length of each of the transfer electrodes along the second charge transfer path, and the center of the length of the first insulating layer coincides substantially with the center of the length of the transfer electrode, and said second insulating layer covers said first insulating layer and both ends thereof align substantially with both ends of each of said transfer electrodes along the second charge transfer path.

10. The device according to claim 9, wherein said first and second insulating layers are formed respectively of segments of first and second insulating films divided in accordance with said transfer electrodes.

11. A solid-state imaging device comprising:
a plurality of photoelectric conversion sections arranged two-dimensionally on a semiconductor substrate;
a plurality of vertical CCDs each arranged adjacent a respective column of said photoelectric sections in side-by-side relation for vertically transferring signal charges read out from said photoelectric conversion sections, each vertical CCD including a plurality of transfer electrodes arranged in a first direction with a first gap across which charge is transferred present between adjacent ones along a first charge transfer path, said transfer electrodes of said vertical CCD comprising first segments of a first polysilicon film divided as said transfer electrodes; and
a horizontal CCD connected to said vertical CCDs and extending in a second direction which intersects said first direction, for receiving the signal charges transferred by said vertical CCDs and transferring received signal charges in said second direction, said horizontal CCD including a plurality of transfer electrodes arranged with a second gap present between adjacent ones along a second charge transfer path in said second direction, said second gap being less than said first gap, said transfer electrodes of said horizontal CCD comprising second segments of said first polysilicon film divided as alternate ones of said transfer electrodes and segments of a second polysilicon film divided as electrodes between said alternate ones of said transfer electrodes, each segment of said second polysilicon film having end portions extending above adjacent two of said second segments of said first polysilicon film along the second charge transfer path, and said second gap being determined by a silicon oxide film obtained by subjecting said second segment of said first polysilicon film to thermal oxidation.

12. The device according to claim 11, further comprising first and second insulating layers provided in this order on the respective transfer electrodes of said vertical CCDs, wherein the length of said first insulating layer is less than the length of each of the transfer electrodes along the first charge transfer path, and the center of the length of the first insulating layer coincides substantially with the center of the length of the transfer electrode, and said second insulating layer covers said first insulating layer and both ends thereof align substantially with both ends of each of said transfer electrodes along the first charge transfer path.

13. The device according to claim 12, wherein said first and second insulating layers are formed respectively of segments of first and second insulating films divided in accordance with said transfer electrodes.

14. The device according to claim 11, wherein refractory metal silicide layers are laminated respectively on said transfer electrodes of the vertical CCDs.

15. The device according to claim 14, wherein said refractory metal silicide layers comprise segments of a refractory metal silicide film divided in accordance with said transfer electrodes.

16. The device according to claim 14, wherein both ends of each said silicide layers are situated inside both ends of each transfer electrode along the first charge transfer path.

17. A solid-state imaging device comprising:
a plurality of photoelectric conversion sections arranged two-dimensionally on a semiconductor substrate;
a plurality of vertical CCDs each arranged adjacent a respective column of said photoelectric sections in side-by-side relation for vertically transferring signal charges read out from said photoelectric conversion sections, each vertical CCD including a plurality of transfer electrodes arranged in a first direction with a first gap across which charge is transferred present between adjacent ones along a first charge transfer path, said transfer electrodes of said vertical CCD comprising first segments of a first polysilicon film divided as said transfer electrodes;

a horizontal CCD connected to said vertical CCDs and extending in a second direction which intersects said first direction, for receiving the signal charges transferred by said vertically CCDs and transferring received signal charges in said second direction, said horizontal CCD including a plurality of transfer electrodes arranged with a second gap present between adjacent ones along a second charge transfer path in said second direction, said second gap being less than said first gap, said transfer electrodes of said horizontal CCD comprising second segments of said first polysilicon film divided as said transfer electrodes; and first and second insulating layers provided in this order on the respective transfer electrodes of said horizontal CCD, the length of said first insulating layer being less than the length of each of the transfer electrodes along the second charge transfer path, the center of the length of the first insulating layer coinciding substantially with the center of the length of the transfer electrode, said second insulating layer covering said first insulating layer, and both ends thereof aligning substantially with both ends of each of said transfer electrodes along the second charge transfer path.

18. The device according to claim 17, wherein said first and second insulating layers are formed respectively of segments of first and second insulating films divided in accordance with said transfer electrodes.

19. The device according to claim 17, wherein refractory metal silicide layers are laminated respectively on said transfer electrodes of the vertical CCDs.

20. The device according to claim 19, wherein said refractory metal silicide layers comprise segments of a refractory metal silicide film divided in accordance with said transfer electrodes.

21. The device according to claim 19, wherein both ends of each of said silicide layers are situated inside both ends of each transfer electrode along the first charge transfer path.

* * * * *